United States Patent
Li

(10) Patent No.: US 11,227,867 B2
(45) Date of Patent: Jan. 18, 2022

(54) METHOD AND DEVICE FOR FINFET SRAM

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/473,205

(22) Filed: Mar. 29, 2017

(65) Prior Publication Data

US 2017/0352668 A1    Dec. 7, 2017

(30) Foreign Application Priority Data

Jun. 1, 2016 (CN) .......................... 201610379443.5

(51) Int. Cl.
*H01L 27/11* (2006.01)
*H01L 21/8238* (2006.01)
(Continued)

(52) U.S. Cl.
CPC .. *H01L 27/1104* (2013.01); *H01L 21/823821* (2013.01); *H01L 21/823842* (2013.01);
(Continued)

(58) Field of Classification Search
CPC ............ H01L 27/1104; H01L 29/1083; H01L 21/823821; H01L 21/823842;
(Continued)

(56) References Cited

U.S. PATENT DOCUMENTS 6,066,881 A * 5/2000 Shimizu ............ H01L 27/10873
257/296
9,530,778 B1 * 12/2016 Lin ....................... H01L 29/511
(Continued)

FOREIGN PATENT DOCUMENTS

CN     103390638      11/2013
EP     3252817 A1     12/2017

OTHER PUBLICATIONS

European Application No. 17173723.2, Extended European Search Report dated Nov. 8, 2017, 8 pages.
(Continued)

*Primary Examiner* — Moin M Rahman
(74) *Attorney, Agent, or Firm* — Anova Law Group, PLLC

(57) ABSTRACT

A method for manufacturing a semiconductor device includes providing a substrate structure including a substrate, an interlayer dielectric layer, multiple trenches in the interlayer dielectric layer including first, second, third trenches for forming respective gate structures of first, second, and third transistors, forming an interface layer on the bottom of the trenches; forming a high-k dielectric layer on the interface layer and sidewalls of the trenches; forming a first PMOS work function adjustment layer on the high-k dielectric layer of the third trench; forming a second PMOS work function adjustment layer in the trenches after forming the first PMOS work function adjustment layer; forming an NMOS work function layer in the trenches after forming the second PMOS work function adjustment layer; and forming
(Continued)

a barrier layer in the trenches after forming the NMOS work function layer and a metal gate layer on the barrier layer.

13 Claims, 15 Drawing Sheets

(51) Int. Cl.
H01L 27/092 (2006.01)
H01L 29/10 (2006.01)
H01L 29/49 (2006.01)

(52) U.S. Cl.
CPC .. H01L 21/823892 (2013.01); H01L 27/0924 (2013.01); H01L 27/0928 (2013.01); H01L 29/1083 (2013.01); H01L 29/4966 (2013.01)

(58) Field of Classification Search
CPC ............. H01L 29/4966; H01L 27/0924; H01L 27/0928; H01L 21/823892; H01L 21/823857; H01L 21/324; H01L 27/0922; H01L 27/0886; H01L 29/785; H01L 29/66545; H01L 21/76846; H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823871; H01L 21/823878; H01L 23/5283; H01L 23/53266; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 29/167; H01L 29/66636; H01L 29/7851; H01L 29/66795; H01L 29/7846; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 21/31051; H01L 21/32115; H01L 29/66681; H01L 29/0657; H01L 29/0882; H01L 29/4983; H01L 29/1037; H01L 29/66659; H01L 29/7835; H01L 29/66689; H01L 29/7816; H01L 21/28088

USPC .......... 257/20, 194, 135–136, 213–413, 900, 257/902–903; 438/136, 137, 455–458, 438/149–165, 173, 192, 206, 212, 424, 438/427, 428, 59

See application file for complete search history.

(56) References Cited

U.S. PATENT DOCUMENTS

| | | | |
|---|---|---|---|
| 2011/0180851 A1* | 7/2011 | Doyle | H01L 21/823807 257/192 |
| 2012/0028434 A1* | 2/2012 | Lee | H01L 21/0206 438/400 |
| 2013/0299918 A1 | 11/2013 | Kim et al. | |
| 2015/0041910 A1* | 2/2015 | Flachowksy | H01L 21/823807 257/369 |
| 2015/0243563 A1 | 8/2015 | Lee et al. | |
| 2016/0086946 A1* | 3/2016 | Yin | H01L 21/823821 257/369 |
| 2016/0225867 A1* | 8/2016 | Kim | H01L 29/4966 |
| 2016/0358920 A1* | 12/2016 | Kim | H01L 21/32139 |
| 2017/0062282 A1* | 3/2017 | Lin | H01L 27/0922 |
| 2017/0125610 A1* | 5/2017 | Romanescu | H01L 29/93 |

OTHER PUBLICATIONS

Chinese Application No. 201610379443.5, Office Action dated Mar. 28, 2019, 23 pages (10 pages of Original Document and 13 pages of English Translation).

* cited by examiner

METHOD AND DEVICE FOR FINFET SRAM

CROSS-REFERENCES TO RELATED APPLICATIONS

The present application claims priority to Chinese patent application No. 201610379443.5, filed with the State Intellectual Property Office of People's Republic of China on Jun. 1, 2016, the content of which is incorporated herein by reference in its entirety.

TECHNICAL FIELD

The present invention relates to semiconductor memory devices, and more particularly to a semiconductor device and method for manufacturing the same.

BACKGROUND

Recently, fin-type transistors, such as fin field effect transistors (finFETs), have been used to replace planar transistors in logic devices. Embedded static random access memory (SRAM) devices have been widely used, SRAM devices have thus, been designed using FinFETs. In a FinFET, the channel has a raised fin-like structure, allowing the gate to be placed on two or more sides of the channel to improve conduction and leakage control. As the fin width is constant, it is not convenient to use the width of the active area to define the finFET SRAM ratio as is the case in conventional planar SRAM devices.

When an SRAM device is formed using finFETs, the effective width is constant, the SRAM ratio may only be adjusted by changing the critical dimension (CD). However, when compared with a planar SRAM device, a finFET RAM device may have a smaller process window. It is thus, challenging to widen the process window for a finFET formed SRAM device.

FIG. 1 is a circuit diagram of a conventional SRAM bit cell that may be used for embodiments of the present invention. The conventional SRAM includes six transistors such as two pull-up (PU) transistors 11 and 14, two pull down (PD) transistors 12 and 15, and two pass gate (PG) transistors 13 and 16. In the SRAM, the PU transistor is typically a stacked metal gate PMOS transistor, and the PD transistor is typically a stacked metal gate NMOS transistor.

For a FinFET SRAM, the supply voltage Vdd may be reduced to below 0.8V, so that the read noise margin decreases, which may represent a challenge in improving the SRAM gain.

In conventional techniques, in order to improve the read noise margin of the SRAM, the β ratio $$\beta = \frac{I_{on(PD)}}{I_{on(PG)}}$$

may be increased, where $I_{on(PD)}$ is the conduction current of the PD transistor, and $I_{on(PG)}$ is the conduction current of the PG transistor. For a dual-port and three-port SRAM, the β ratio is particularly difficult to improve. In order to improve the write margin of the SRAM device, the γ ratio $$\gamma = \frac{I_{on(PG)}}{I_{on(PU)}}$$

may be increased, where $I_{on(PG)}$ is the conduction current of the PG transistor, and $I_{on(PU)}$ is the conduction current of the PU transistor. In the prior art, there is a limit in increasing the β ratio and the γ ratio, which presents a design challenge.

BRIEF SUMMARY OF THE INVENTION

Embodiments of the present invention provide a method for manufacturing a semiconductor device. The method includes:

(a) providing a substrate structure including a substrate, forming an interlayer dielectric layer on the substrate, forming a plurality of trenches in the interlayer dielectric layer exposing a surface of the substrate and comprising at least a first trench for forming a gate structure of a first transistor, a second trench for forming a gate structure of a second transistor, and a third trench for forming a gate structure of a third transistor;

(b) forming an interface layer on the bottom of the plurality of trenches;

(c) forming a high-k dielectric layer on the interface layer and sidewalls of the plurality of trenches;

(d) forming a first PMOS work function adjustment layer on the high-k dielectric layer of the third trench;

(e) forming a second PMOS work function adjustment layer in the plurality of trenches after forming the first PMOS work function adjustment layer;

(f) forming an NMOS work function layer in the plurality of trenches after forming the second PMOS work function adjustment layer; and (g) forming a barrier layer in the plurality of trenches after forming the NMOS work function layer, and forming a metal gate layer on the barrier layer.

In one embodiment, the first PMOS work function adjustment layer and the second PMOS work function adjustment layer increase a threshold voltage of the third transistor, and the NMOS work function adjustment layer increases a threshold voltage of the first transistor.

In one embodiment, the method may further include, prior to forming the interlayer dielectric layer on the substrate, performing a first doping into the substrate to form a first doped region; performing a second doping into the substrate to form a second doped region; and performing a third doping into the substrate to form a third doped region.

In one embodiment, the first doped region includes an N-type dopant; the second doped region comprises a first P-type dopant; and the third doped region includes a second P-type dopant.

In one embodiment, the first doped region has a dopant concentration higher than a dopant concentration of the third doped region.

In one embodiment, the first doped region has a dopant concentration in a range between $1\times10^{16}$ and $1\times10^{17}$ atoms/cm$^3$; the second doped region has a dopant concentration in a range between $1\times10^{16}$ and $3\times10^{18}$ atoms/cm$^3$; and the third doped region has a dopant concentration in a range between $1\times10^{16}$ and $1\times10^{17}$ atoms/cm$^3$.

In one embodiment, forming the first PMOS work function adjustment layer on the high-k dielectric layer of the third trench may include forming the first PMOS work function adjustment layer on the high-k dielectric layer of the first, second, and third trenches; and removing the first PMOS work function adjustment layer of the first and second trenches to expose a surface of the high-k dielectric layer.

In one embodiment, the plurality of trenches may further include a fourth trench for forming a gate structure of a logic PMOS transistor, a fifth trench for forming a gate structure of a logic NMOS transistor. The fourth and fifth trenches each expose a surface portion of the substrate. Forming the first PMOS work function adjustment layer on the high-k dielectric layer of the third trench may further include forming the first PMOS work function adjustment layer on the high-k dielectric layer of the fourth and fifth trenches; and removing the first PMOS work function adjustment layer of the fourth and fifth trenches to expose a surface of the high-k dielectric layer.

In one embodiment, the first and second PMOS work function adjustment layers each include titanium nitride, and the NMOS work function adjustment layer comprises titanium aluminum carbide.

In one embodiment, the NMOS work function adjustment layer has a thickness greater than a sum of thicknesses of the first and second PMOS work function adjustment layers.

In one embodiment, the first PMOS work function adjustment layer has a thickness in a range between 5 Å and 15 Å; the second PMOS work function adjustment layer has a thickness in a range between 10 Å and 35 Å; and the NMOS work function adjustment layer has a thickness in a range between 30 Å and 80 Å.

In one embodiment, the interface layer includes silicon dioxide; the barrier layer includes titanium nitride; the metal gate layer includes tungsten.

In one embodiment, the interface layer has a thickness in a range between 5 Å and 10 Å; the high-k dielectric layer has a thickness in a range between 5 Å and 20 Å; the barrier layer has a thickness in a range between 15 Å and 70 Å.

In one embodiment, the first transistor is a pull-up transistor of an SRAM; the second transistor is a pull-down transistor of the SRAM; and the third transistor is a transfer gate transistor of the SRAM.

Embodiments of the present invention also provide a semiconductor device. The semiconductor device includes a substrate; an interlayer dielectric layer on the substrate; a plurality of trenches comprising at least a first trench for forming a gate structure of a first transistor, a second trench for forming a gate structure of a second transistor, and a third trench for forming a gate structure of a third transistor, each of the trenches having a bottom exposing a portion of a surface of the substrate; an interface layer on the bottom of each of the trenches; and a high-k dielectric layer on the interface layer. The semiconductor device further includes a first PMOS work function adjustment layer on the high-k dielectric layer of the third trench; a second PMOS work function adjustment layer on the high-k dielectric layer of the first and second trenches and on the first PMOS work function adjustment layer of the first trench; an NMOS work function adjustment layer on the second PMOS work function adjustment layer of the first, second, and third trenches; a barrier layer on the NMOS work function adjustment layer; and a metal gate layer on the barrier layer.

In one embodiment, the plurality of trenches may further include a fourth trench for forming a gate structure of a logic PMOS transistor and a fifth trench for forming a gate structure of a logic NMOS transistor. The fourth and fifth trenches each expose a surface portion of the substrate.

In one embodiment, the semiconductor device further includes the first PMOS work function adjustment layer on the high-k dielectric layer of the fourth trench; the second PMOS work function adjustment layer on the high-k dielectric layer of the fifth trench and on the first PMOS work function adjustment layer of the fourth trench; the NMOS work function adjustment layer on the second PMOS work function adjustment layer of the fourth and fifth trenches; a barrier layer on the NMOS work function adjustment layer on the second PMOS work function adjustment layer of the fourth and fifth trenches; and a metal gate layer on the barrier layer.

In one embodiment, the first and second PMOS work function adjustment layers each include titanium nitride, and the NMOS work function adjustment layer includes titanium aluminum carbide.

In one embodiment, the NMOS work function adjustment layer has a thickness greater than a sum of thicknesses of the first and second PMOS work function adjustment layers.

In one embodiment, the first PMOS work function adjustment layer has a thickness in a range between 5 Å and 15 Å; the second PMOS work function adjustment layer has a thickness in a range between 10 Å and 35 Å; the NMOS work function adjustment layer has a thickness in a range between 30 Å and 80 Å.

In one embodiment, the interface layer comprises silicon dioxide; the barrier layer comprises titanium nitride; the metal gate later comprises tungsten.

In one embodiment, the interface layer has a thickness in a range between 5 Å and 10 Å; the high-k dielectric layer has a thickness in a range between 5 Å and 20 Å; the barrier layer has a thickness in a range between 15 Å and 70 Å.

In one embodiment, the first transistor is a pull-up transistor of an SRAM; the second transistor is a pull-down transistor of the SRAM; the third transistor is a transfer gate transistor of the SRAM.

The following detailed description together with the accompanying drawings will provide a better understanding of the nature and advantages of the present invention.

DETAILED DESCRIPTION OF THE INVENTION

Figure 1:
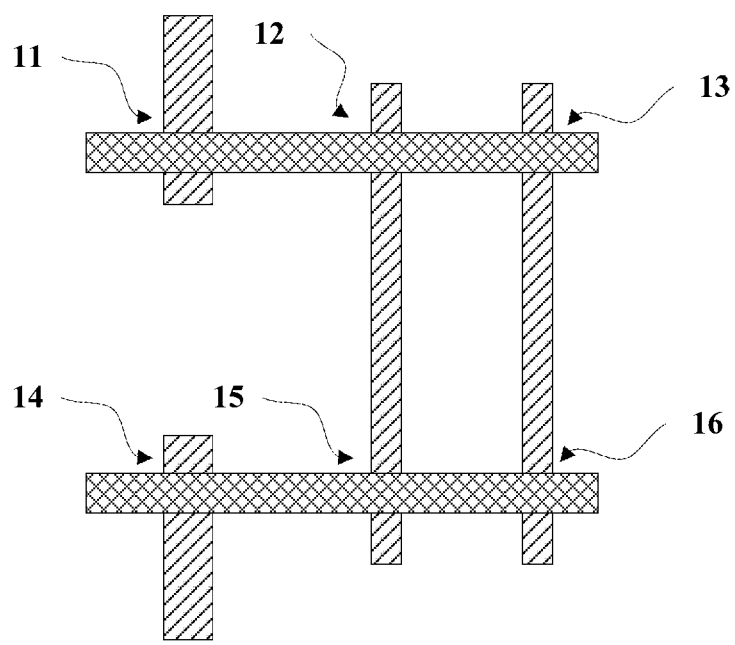
FIG. 1 is a schematic circuit diagram of an conventional SRAM that may be applied to embodiments of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms s as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

A highly doped source and drain ion implantation is referred to as an ion implantation of source and drain regions with impurities to a concentration of at least 10E18 ($10^{18}$) atoms per cm$^3$ or a dose of at least 10E14 ($10^{14}$) atoms per cm$^2$. A lightly doped source and drain ion implantation is referred to as an ion implantation of source and drain regions with impurities to a concentration in the range of 10E14 ($10^{14}$) to 10E15 ($10^{15}$) atoms per cm$^3$ or a dose of 10E10 to 10E11 ($10^{10}$ to $10^{11}$) atoms per cm$^2$.

The term "ratio" is referred to as the driving strength ratio between the different types of transistors. For example, an "α" (alfa) ratio is referred to as the driving strength ratio between the pull-down transistor and the pull-up transistor. A "β" (beta) ratio is referred to as the driving strength ratio between the pull-down transistor and the pass-gate transistor. A "γ" (gamma) ratio is referred to as the driving strength ratio between the pass-gate transistor and the pull-up transistor.

The use of the terms "first", "second", "third", etc. do not denote any order, but rather the terms first, second, third etc. are used to distinguish one element from another. Furthermore, the use of the terms "a", "an", etc. does not denote a limitation of quantity, but rather denote the presence of at least one of the referenced items.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

Figure 2:
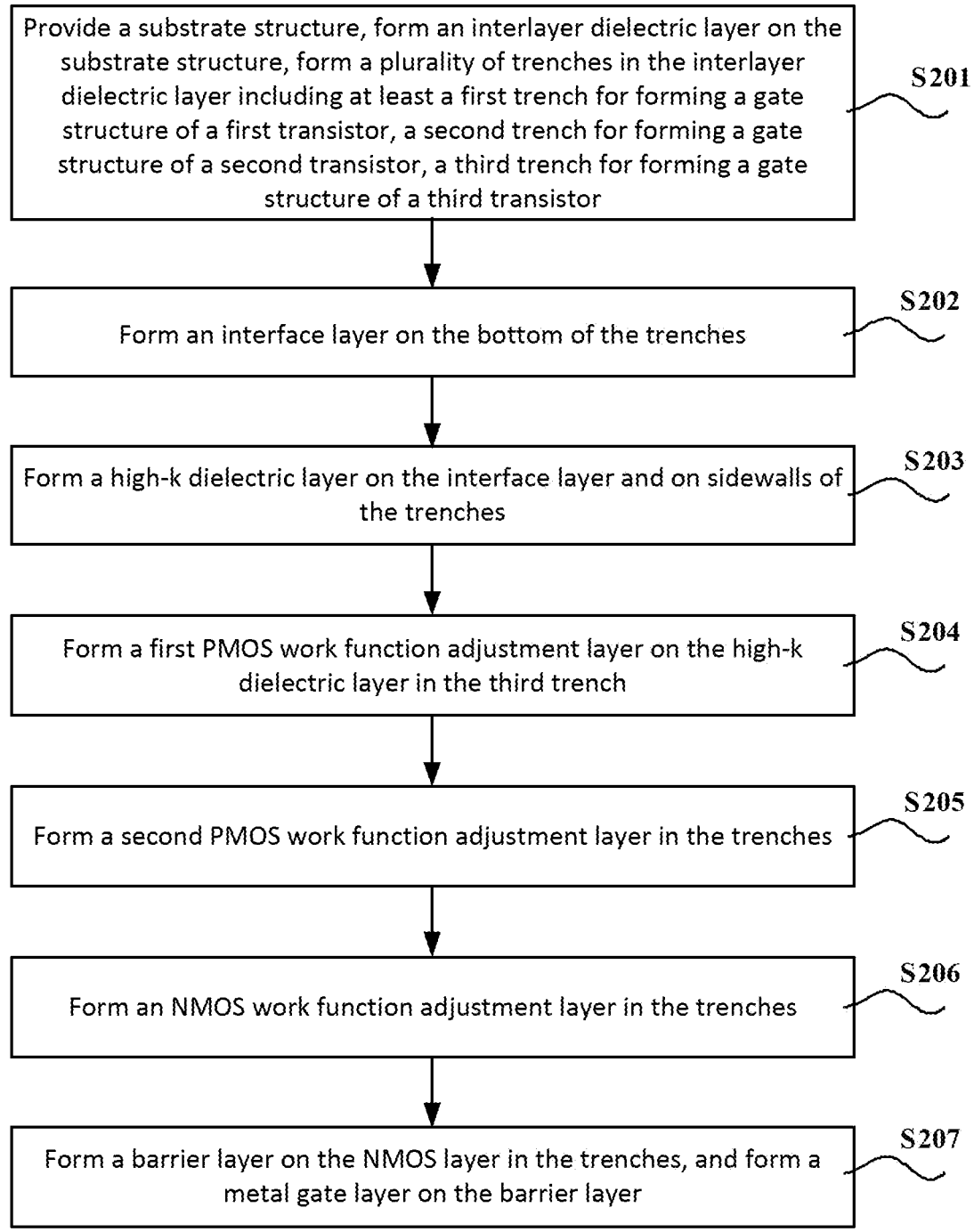
FIG. 2 is a flowchart of a method of fabricating a semiconductor device according to some embodiments of the present invention.

FIG. 2 is a flowchart of a method for manufacturing a semiconductor device according to some embodiments of the present invention. FIG. 3A through 3K are cross-sectional views illustrating intermediate stages of a semiconductor device in different process steps of a method of manufacturing according to some embodiments of the present invention.

Referring to FIG. 2, the method may include providing a substrate structure in step S201.

Figure 3A:
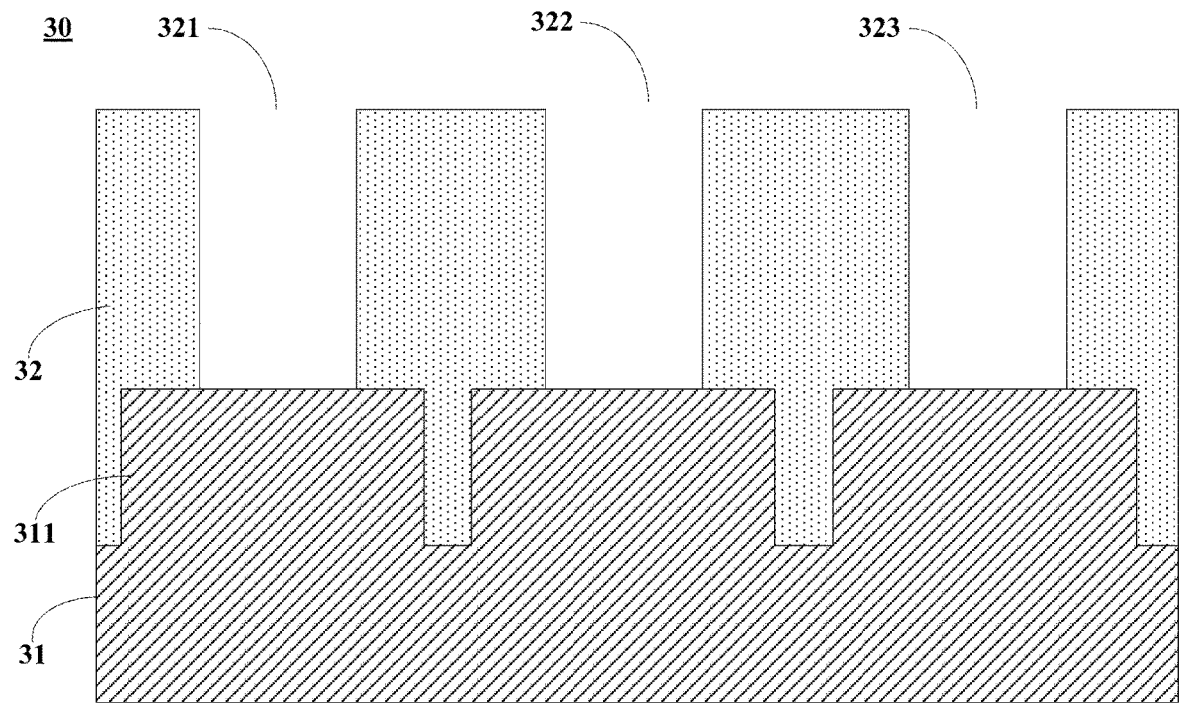
FIG. 3A is a simplified cross-sectional view illustrating an intermediate process step of a method of fabricating a semiconductor device according to some embodiments of the present invention.

FIG. 3A is a cross-sectional view illustrating an intermediate stage of a semiconductor structure in step S201 according to an embodiment of the present invention. As shown in FIG. 3A, a substrate structure 30 is provided. Substrate structure 30 may include a substrate (e.g., silicon substrate) 31 and an interlayer dielectric layer (e.g., silicon dioxide) 32 formed on substrate 31. Interlayer dielectric layer 32 may include a plurality of trenches that expose a surface portion of substrate 31. For example, the plurality of trenches may include a first trench 321 for forming a gate structure of a first transistor (e.g., a pull-up transistor for use in a SRAM), a second trench 322 for forming a gate structure of a second transistor (e.g., a pull-down transistor for use in the SRAM), and a third trench 323 for forming a gate structure of a third transistor (e.g., a transfer gate transistor for use in the SRAM).

In some embodiments, referring still to FIG. 3A, substrate 31 may include a fin structure 311 having a plurality of fins, each of the fins includes a corresponding trench formed thereon. One of skill in the art will appreciate that the substrate structure may also include a source and a drain (not shown) disposed in the fin on opposite sides of the trench of the fin.

For ease of illustration, the fins of the respective transistors are shown in the cross-sectional view along the transversal direction, but it will be appreciated that the fins can also be shown in the longitudinal direction or other directions. For example, the fins are not disposed on the same straight line. The scope of the present invention is not limited to the arrangement of the fins shown in the drawings.

Referring back to FIG. 2, an interface layer is formed on the exposed surface of the substrate on the bottom of the trenches in step S202.

Figure 3B:
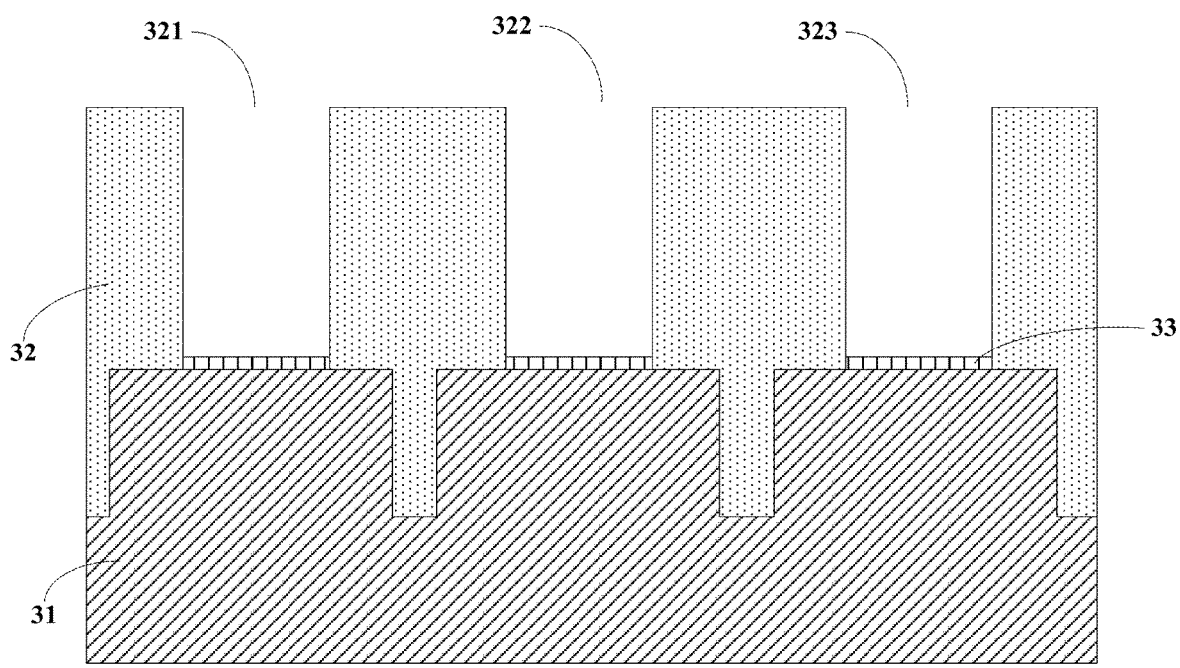
FIG. 3B is a simplified cross-sectional view illustrating an intermediate process step of a method of fabricating a semiconductor device according to some embodiments of the present invention.

FIG. 3B is a cross-sectional view illustrating an intermediate stage of a semiconductor structure in step S202 according to an embodiment of the present invention. As shown in FIG. 3B, an interface layer 33 is formed on the exposed substrate surface on the bottom of the trenches (e.g., first, second, third trenches 321, 322, 323) using a deposition or oxidation process. In some embodiments, the interface layer may include silicon dioxide and has a thickness in the range between 5 Å and 10 Å, e.g., 7 Å.

Referring back to FIG. 2, a high-k dielectric layer is formed on the interface layer and on sidewalls of the trenches in step S203.

Figure 3C:
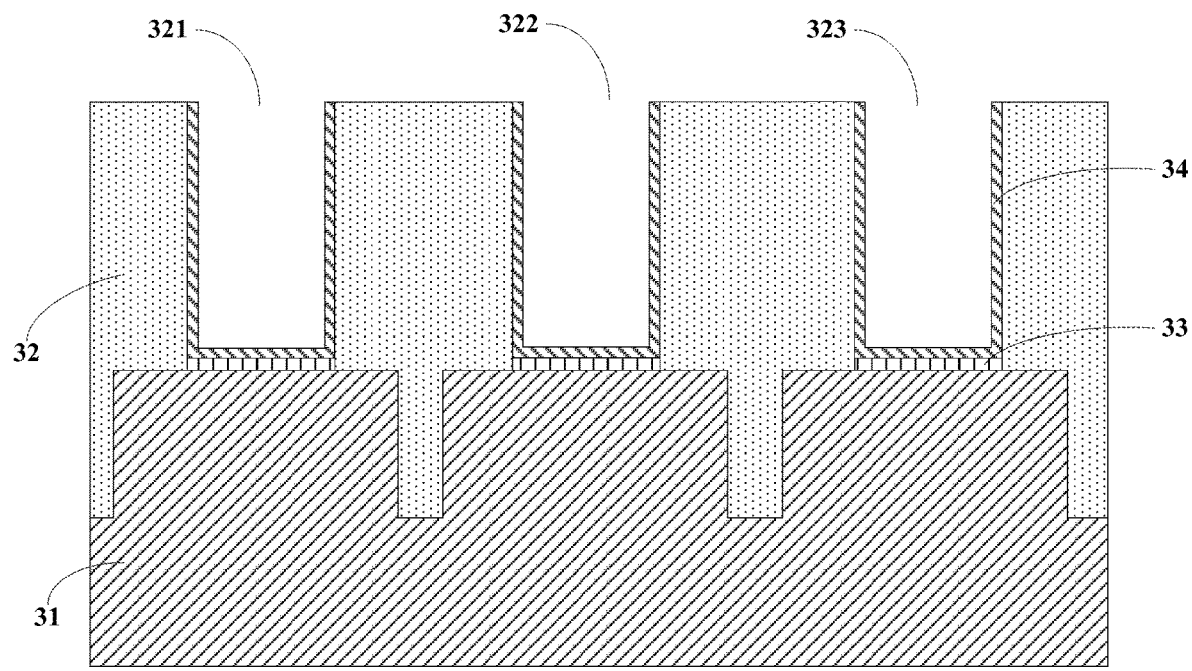
FIG. 3C is a simplified cross-sectional view illustrating an intermediate process step of a method of fabricating a semiconductor device according to some embodiments of the present invention.

FIG. 3C is a cross-sectional view illustrating an intermediate stage of a semiconductor structure in step S203 according to an embodiment of the present invention. As shown in FIG. 3C, a high-k dielectric layer 34 is formed on interface layer 33 and on sidewalls of the trenches (e.g., first, second, third trenches 321, 322, 323) using a deposition process. In some embodiments, the high-k dielectric layer may include silicon nitride and has a thickness in the range between 5 Å and 20 Å, e.g., 10 Å or 15 Å.

Referring back to FIG. 2, a first PMOS work function adjustment layer is formed on the high-k dielectric layer in step S204.

Figure 3D:
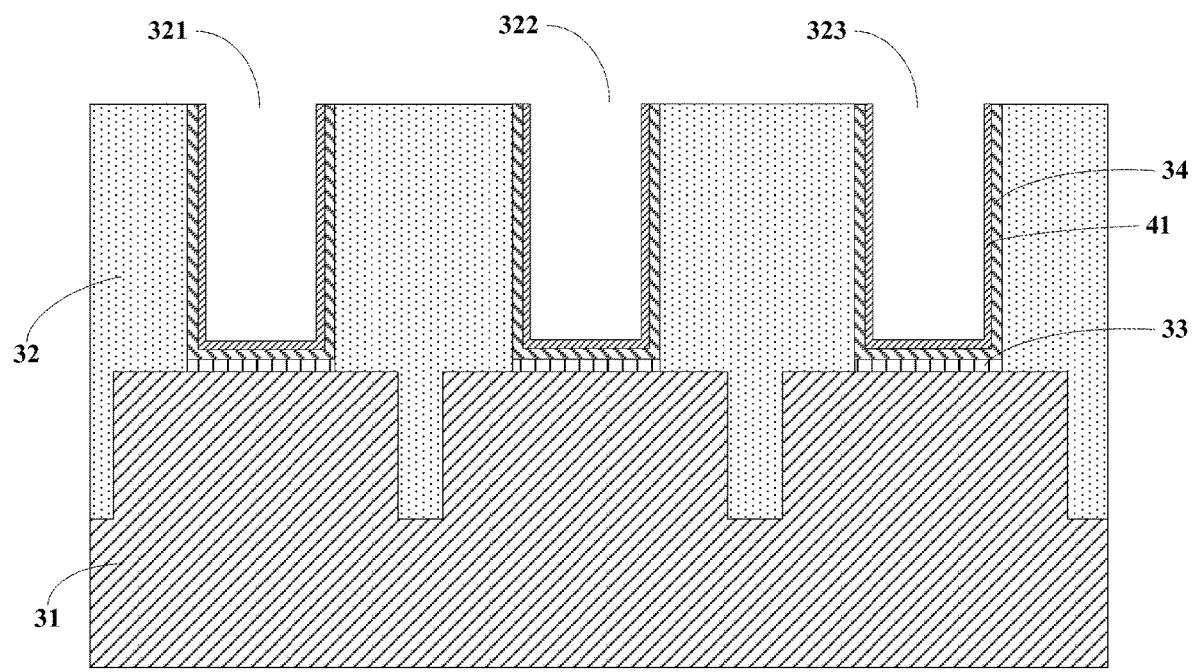
FIG. 3D is a simplified cross-sectional view illustrating an intermediate process step of a method of fabricating a semiconductor device according to some embodiments of the present invention.

FIG. 3D is a cross-sectional view illustrating an intermediate stage of a semiconductor structure in step S204 according to an embodiment of the present invention. As shown in FIG. 3D, a first PMOS work function adjustment layer 41 is formed on the high-k dielectric layer of third trench 323 using a deposition process. In some embodiments, the first PMOS work function adjustment layer includes titanium nitride (TiN) and has a thickness in the range between 5 Å and 15 Å, e.g., 10 Å.

In some embodiments, the first PMOS work function adjustment layer is formed on the high-k dielectric layer of the trenches (e.g., first, second, third trenches 321, 322, 323) using a deposition process in step S204, as shown in FIG. 3D.

Figure 3E:
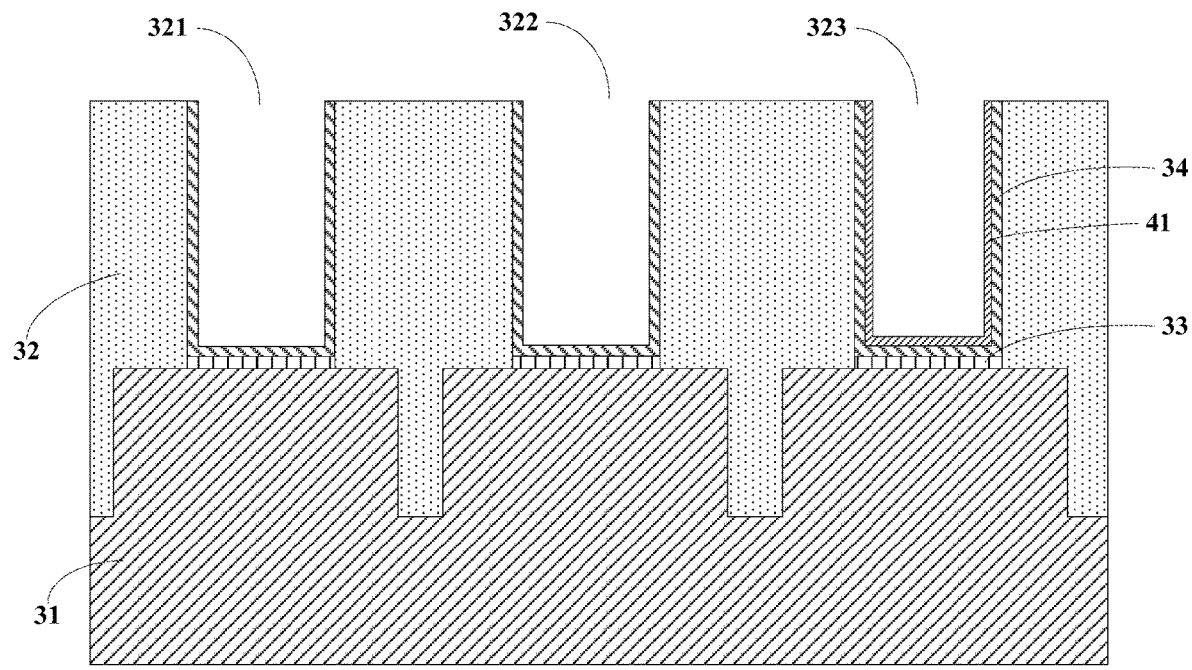
FIG. 3E is a simplified cross-sectional view illustrating an intermediate process step of a method of fabricating a semiconductor device according to some embodiments of the present invention.

Optionally, the first PMOS work function adjustment layer on the high-k dielectric layer of first trench 321 and second trench 322 are removed to expose the surface of the high-k dielectric layer of first trench 321 and second trench 322, as shown in FIG. 3E. For example, a patterned mask layer (e.g., photoresist) is formed on third trench 323 while exposing the first PMOS work function adjustment layers in first and second trenches 321 and 322, then the exposed first PMOS work function adjustment layers in first and second trenches 321 and 322 are removed using an etching process. Thereafter, the patterned mask layer is removed using an etching process to obtain the structure shown in FIG. 3E.

In some embodiments, prior to step S204 and after step S203, the method may also include performing an annealing process on the semiconductor structure shown in FIG. 3C. In an embodiment, the annealing process may employ a spike annealing process.

Referring back to FIG. 2, a second PMOS work function adjustment layer is formed in the trenches in step S205.

Figure 3F:
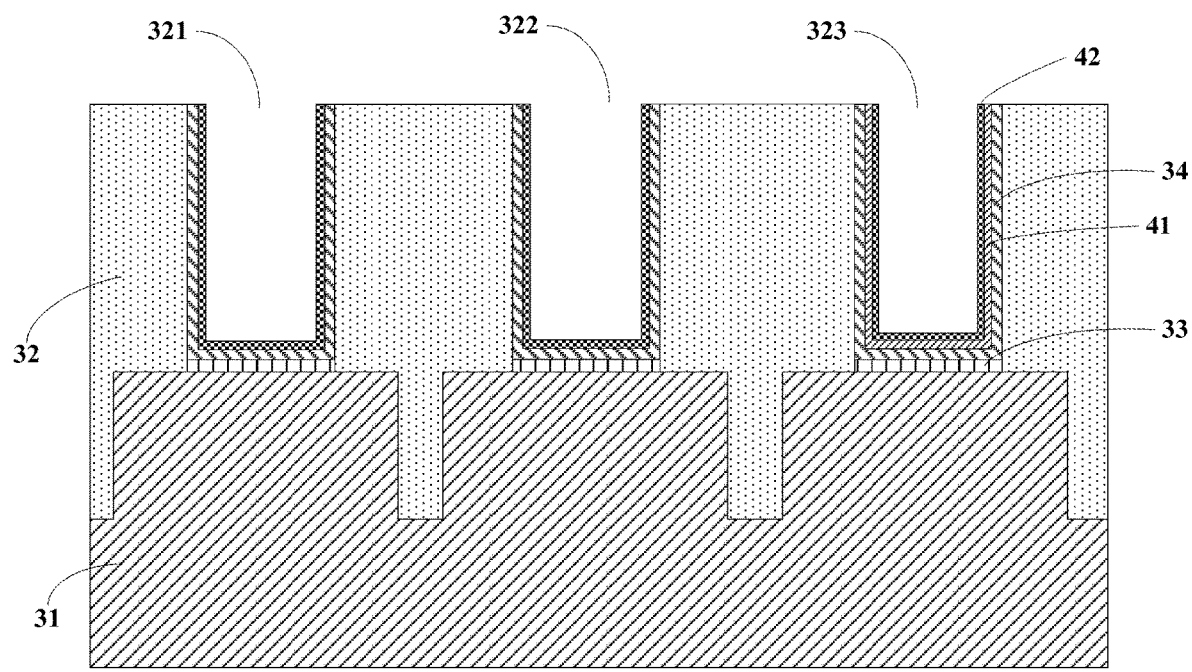
FIG. 3F is a simplified cross-sectional view illustrating an intermediate process step of a method of fabricating a semiconductor device according to some embodiments of the present invention.

FIG. 3F is a cross-sectional view illustrating an intermediate stage of a semiconductor structure in step S205 according to an embodiment of the present invention. As shown in FIG. 3F, a second PMOS work function adjustment layer 42 is formed on the trenches (e.g., first, second, third trenches 321, 322, 323) using a deposition process. In some embodiments, the second PMOS work function adjustment layer includes titanium nitride (TiN) and has a thickness in the range between 10 Å and 35 Å, e.g., 20 Å, 30 Å, etc.

Referring back to FIG. 2, an NMOS work function adjustment layer is formed in the trenches in step S206.

Figure 3G:
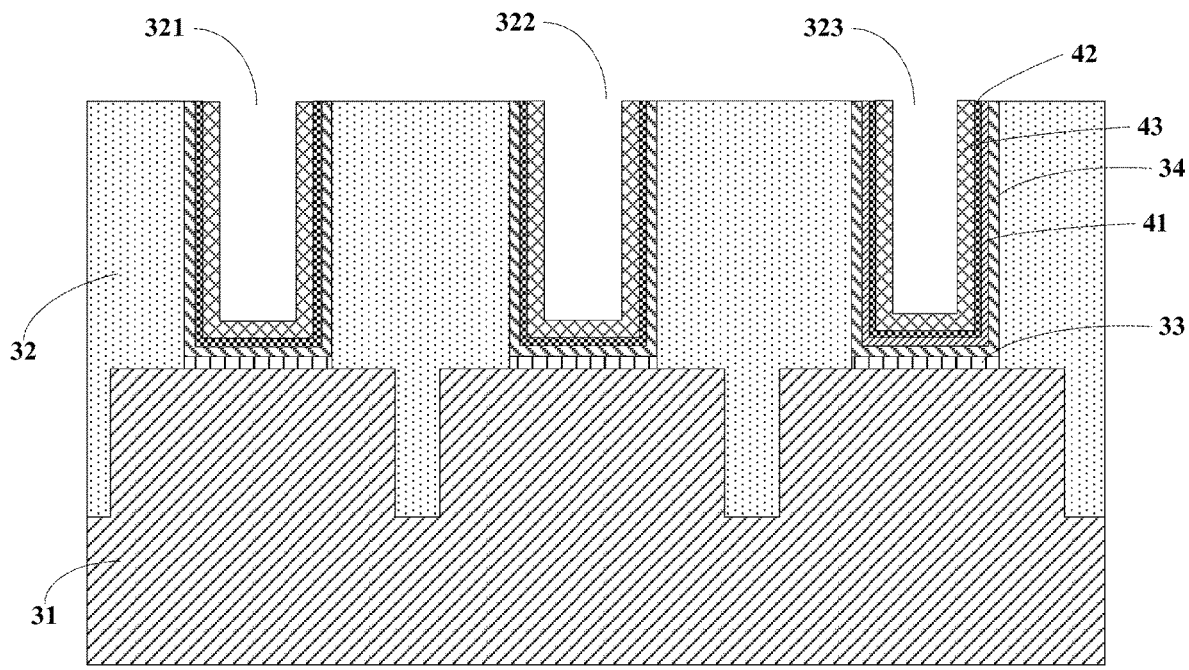
FIG. 3G is a simplified cross-sectional view illustrating an intermediate process step of a method of fabricating a semiconductor device according to some embodiments of the present invention.

FIG. 3G is a cross-sectional view illustrating an intermediate stage of a semiconductor structure in step S206 according to an embodiment of the present invention. As shown in FIG. 3G, an NMOS work function adjustment layer 43 is formed on the trenches (e.g., first, second, third trenches 321, 322, 323) using a deposition process. In some embodiments, the NMOS work function adjustment layer includes titanium aluminum carbide (TiAlC) and has a thickness in the range between 30 Å and 80 Å, e.g., 40 Å, 50 Å, 70 Å, etc.

In some embodiments, the thickness of the NMOS work function adjustment layer is greater than the sum of the thicknesses of the first PMOS work function adjustment layer and the second PMOS work function adjustment layer.

Referring back to FIG. 2, a barrier layer and a metal electrode layer are formed in the trenches in step S207.

Figure 3H:
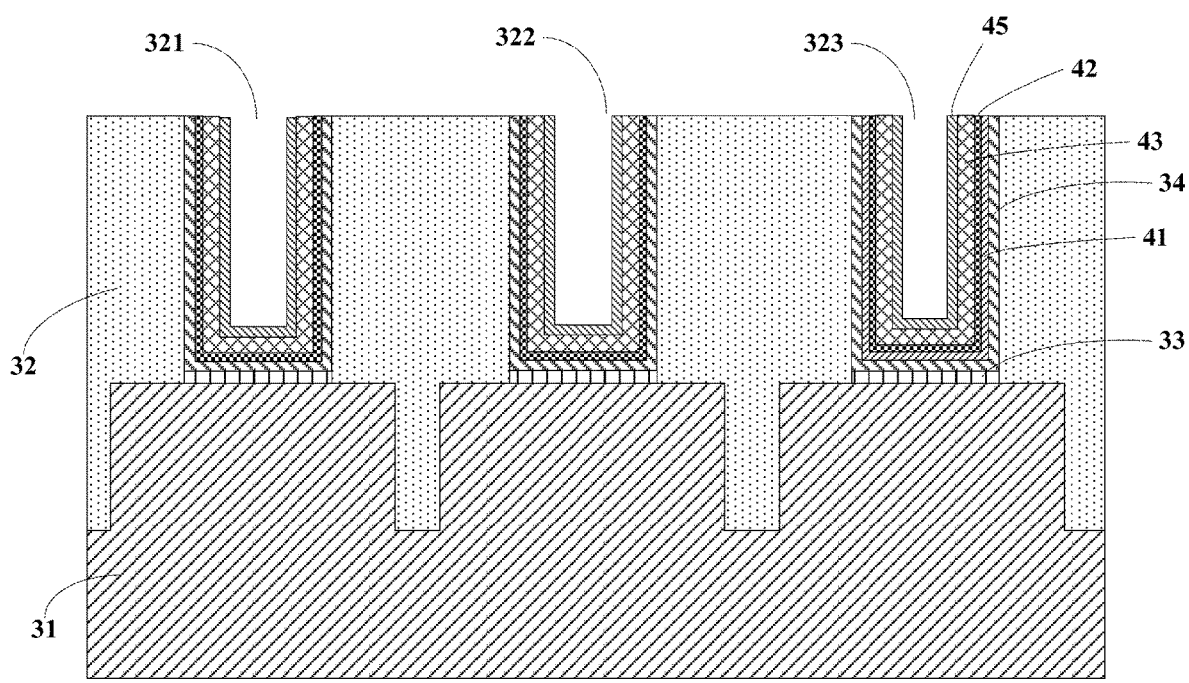
FIG. 3H is a simplified cross-sectional view illustrating an intermediate process step of a method of fabricating a semiconductor device according to some embodiments of the present invention.
Figure 3I:
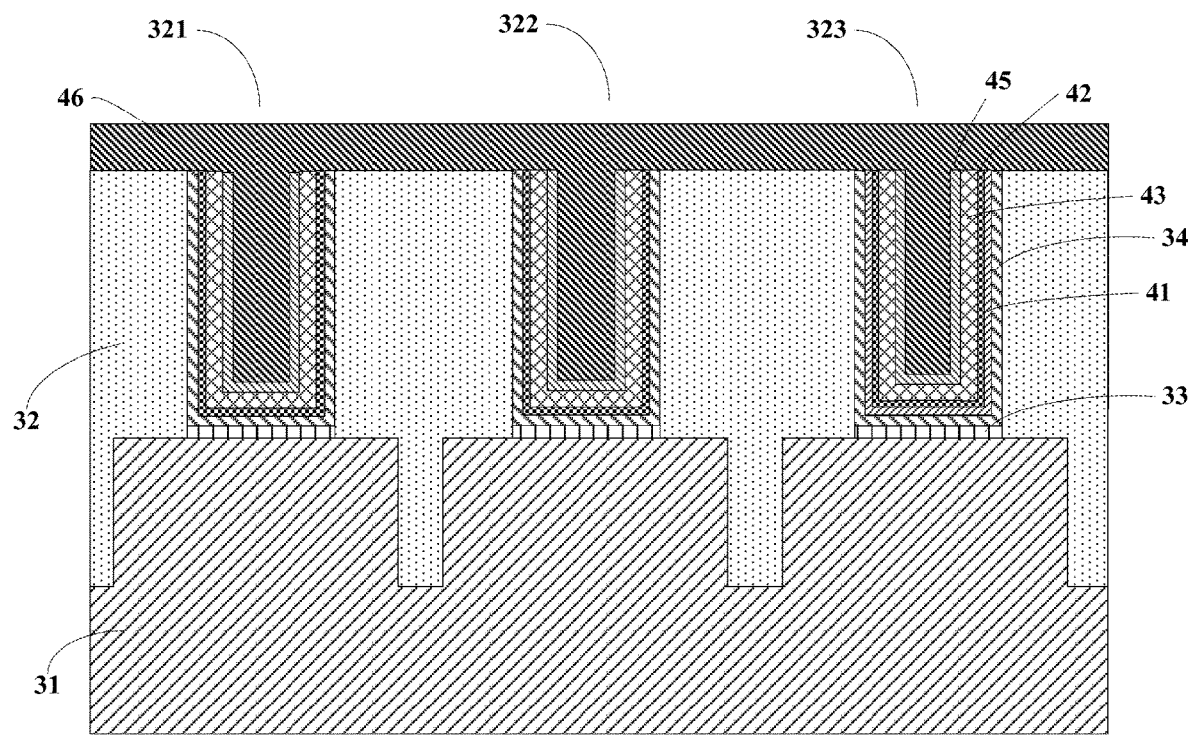
FIG. 3I is a simplified cross-sectional view illustrating an intermediate process step of a method of fabricating a semiconductor device according to some embodiments of the present invention.

FIG. 3H is a cross-sectional view illustrating an intermediate stage of a semiconductor structure in step S207 according to an embodiment of the present invention. As shown in FIG. 3H, a barrier layer 45 is formed in the trenches (e.g., first, second, third trenches 321, 322, 323) using a deposition process, and then a metal electrode layer 46 is formed on barrier layer 45 using a deposition process, as shown in FIG. 3I. The barrier layer may include titanium nitride. The metal electrode layer may include a metal such as tungsten. In some embodiments, the barrier layer has a thickness in the range between 15 Å and 70 Å, e.g., 30 Å, 50 Å, etc.

In some embodiments, barrier layer 45 is formed in the trenches (e.g., first, second, third trenches 321, 322, 323) using a deposition process, as shown in FIG. 3H. The barrier layer is used to bond, absorb and block the tungsten diffusion.

Optionally, a metal electrode layer 46 is formed on barrier layer 45 using a deposition process to fill the trenches ((e.g., first, second, third trenches 321, 322, 323), as shown in FIG. 3I.

Figure 3J:
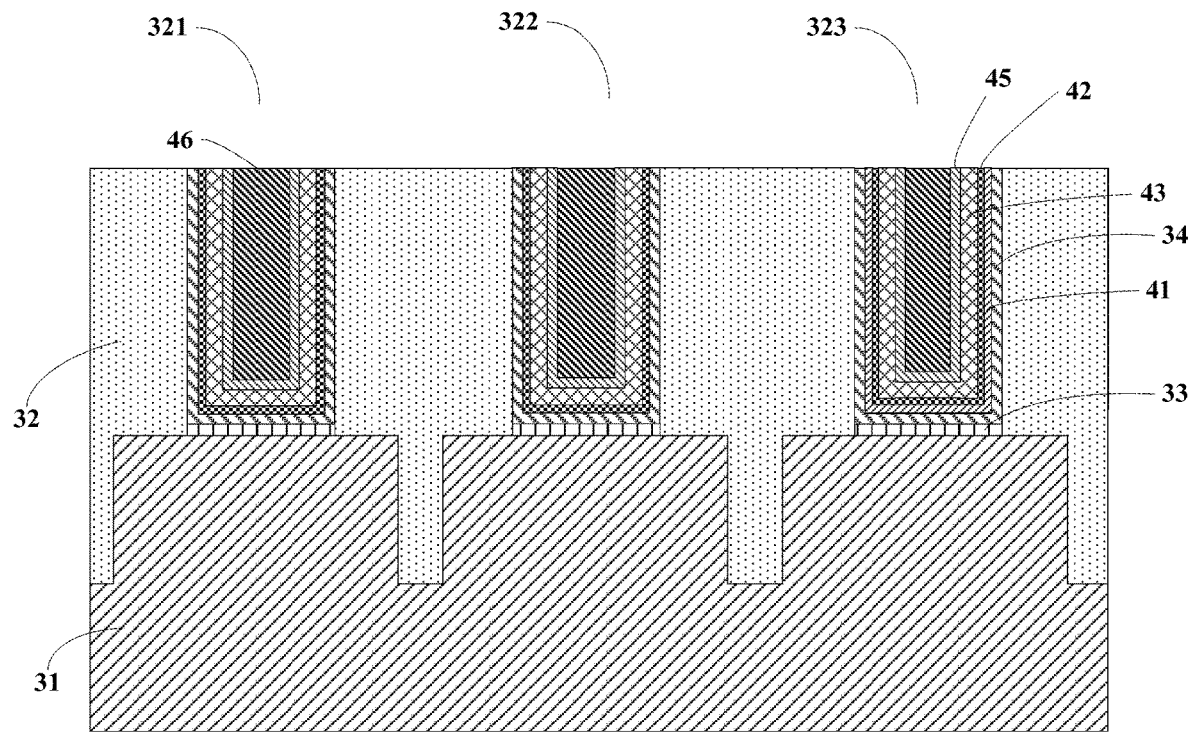
FIG. 3J is a simplified schematic diagram illustrating an intermediate process step of a method of fabricating a semiconductor device according to some embodiments of the present invention.

Optionally, a planarization (e.g., chemical mechanical polishing) process may be performed on metal electrode layer 46, as shown in FIG. 3J.

Thus, the above-described steps embodiments of the present invention provide a method for manufacturing a semiconductor device according to some embodiments of the present invention. According to some embodiments, the first PMOS work function adjustment layer and the second PMOS work function adjustment layer may be used to increase the threshold voltage of the third transistor. For the third transistor, both the first PMOS work function adjustment layer and the second PMOS work function adjustment layer are relatively thick and relatively close to the channel region below the gate structure in the substrate (not shown in the drawings), so that the first and second PMOS work function adjustment layers can adjust the threshold voltage of the device, while the NMOS work function adjustment layer is relatively thick but spaced further away (i.e., remote) from the channel region, so that it has a negligible threshold voltage adjustment effect on the device. Thus, the work function layer of the gate structure of the third transistor is mainly based on the PMOS work function layers.

In an embodiment, the third transistor may be a transfer gate transistor for use in an SRAM. In the prior art, the transfer gate is an NMOS transistor having an NMOS work function layer in the gate structure. In contrast, according to embodiments of the present invention, the work function layer of the third transistor utilizes a PMOS work function adjustment layer that can increase the threshold voltage of the third transistor in relation to the NMOS work function layer. In other words, comparing with the prior art, embodiments of the present invention may increase the threshold voltage of the transfer gate transistor, resulting in a decrease in the conduction current $I_{on(PG)}$ of the transfer gate transistor.

The conduction current of the pull-down transistor may remain constant. This is because the second transistor may be the pull-down transistor of the SRAM and the gate structure of the second transistor include the second PMOS work function layer and the NMOS work function layer. Since the NMOS work function layer is thicker than the second PMOS work function layer, the NMOS work function layer has a greater threshold voltage adjustment effect than the second PMOS work function layer, whose threshold voltage adjustment effect is negligible. Thus, the work function layer of the gate structure of the second transistor is mainly based on the NMOS work function layer. This is similar to the case where the NMOS work function layer is employed in the gate structure of the pull-down transistor of the prior art, thus, the conduction current $I_{on(PD)}$ of the pull-down transistor may be considered as constant.

Therefore, when the conduction current $I_{on(PG)}$ of the transfer gate transistor decreases, and the conduction current $I_{on(PD)}$ of the pull-down transistor remains constant, the β ratio $$\beta = \frac{I_{on(PD)}}{I_{on(PG)}}$$

may increase, so that the read noise margin of the SRAM can be improved.

In some embodiments, the NMOS work function layer may be used to increase the threshold voltage of the first transistor. For example, the first transistor may be a pull-up transistor for use in an SRAM. Because the gate structure of the first transistor includes the second PMOS work function adjustment layer and the NMOS work function layer, and the NMOS work function layer is thicker than the second PMOS work function adjustment layer, the NMOS work function layer is the main contributor to the threshold voltage adjustment of the first transistor, and the second PMOS work function adjustment layer has a negligible contribution to the first transistor threshold voltage adjustment. Thus, the work function layer of the gate structure of the first transistor is mainly the NMOS work function layer. In the prior art, the pull-up transistor is typically a PMOS transistor having the gate structure including a PMOS work function layer. Since the NMOS work function adjustment layer may increase the threshold voltage of the first transistor relative to the PMOS work function adjustment layer, embodiments of the present invention provide an increase of the threshold voltage of the pull-up transistor relative to the conventional pull-up transistor, resulting in a decrease of the conduction current $I_{on(PU)}$ of the pull-up transistor.

Thus, in some embodiments, for the γ ratio $$\gamma = \frac{I_{on(PG)}}{I_{on(PU)}},$$

both the conduction currents $I_{on(PG)}$ and $I_{on(PU)}$ decrease. According to the present invention, by taking the following described steps, the conduction current $I_{on(PU)}$ can be made significantly smaller than the conduction current $I_{on(PG)}$, so that the γ ratio increases to improve the write margin of the SRAM.

In one exemplary embodiment, the thickness of the NMOS work function adjustment layer can be made greater than the sum of the thicknesses of the first PMOS work function adjustment layer and the second PMOS work function adjustment layer. That is, the thickness of the work function layer can be adjusted in the manufacturing process such that the NMOS work function adjustment layer of the pull-up transistor (i.e., the first transistor) is thicker than the PMOS work function adjustment layer of the transfer gate transistor (i.e., the third transistor), so that the threshold voltage of the pull-up transistor is greatly increased, the conduction current $I_{on(PU)}$ is much smaller than the conduction current $I_{on(PU)}$ to increase the γ ratio.

In another exemplary embodiment, the channel dopant concentration in the substrate of the pull-up transistor (i.e., the first transistor) may be made greater than that of the of the transfer gate transistor ((i.e., the third transistor), so that the threshold voltage of the pull-up transistor is greatly increased, the conduction current $I_{on(PU)}$ is much smaller than the conduction current $I_{on(PU)}$ to increase the γ ratio.

In some embodiments, step S201 also includes forming an interlayer dielectric layer on the substrate. Optionally, prior to forming the interlayer dielectric layer, step S201 may also include performing a first doping onto a portion of the substrate on which the first trench is to be formed, performing a second doping onto a portion of the substrate on which the second trench is to be formed, and performing a third doping onto a portion of the substrate on which the third trench is to be formed.

In an exemplary embodiment, the first doping may be of an N-type; the second doping may be of a P-type, and the third doping may be of the P-type.

In some embodiments, the first dopant concentration of the first doping is greater than the third dopant concentration of the third doping.

In some embodiments, the first dopant concentration is in the range between $1 \times 10^{16}$ and $1 \times 10^{17}$ atoms/cm$^3$.

In some embodiments, the second dopant concentration is in the range between $1 \times 10^{16}$ and $3 \times 10^{18}$ atoms/cm$^3$.

In some embodiments, the third dopant concentration is in the range between $1 \times 10^{16}$ and $1 \times 10^{17}$ atoms/cm$^3$.

FIG. 4A through FIG. 4G are cross-sectional views illustrating intermediate stages of a semiconductor device in different process steps of a method of manufacturing according to some embodiments of the present invention. The processes of performing the first doping, the second doping and the third doping onto the substrate will be described in detail with reference to FIGS. 4A through 4G.

Figure 4A:
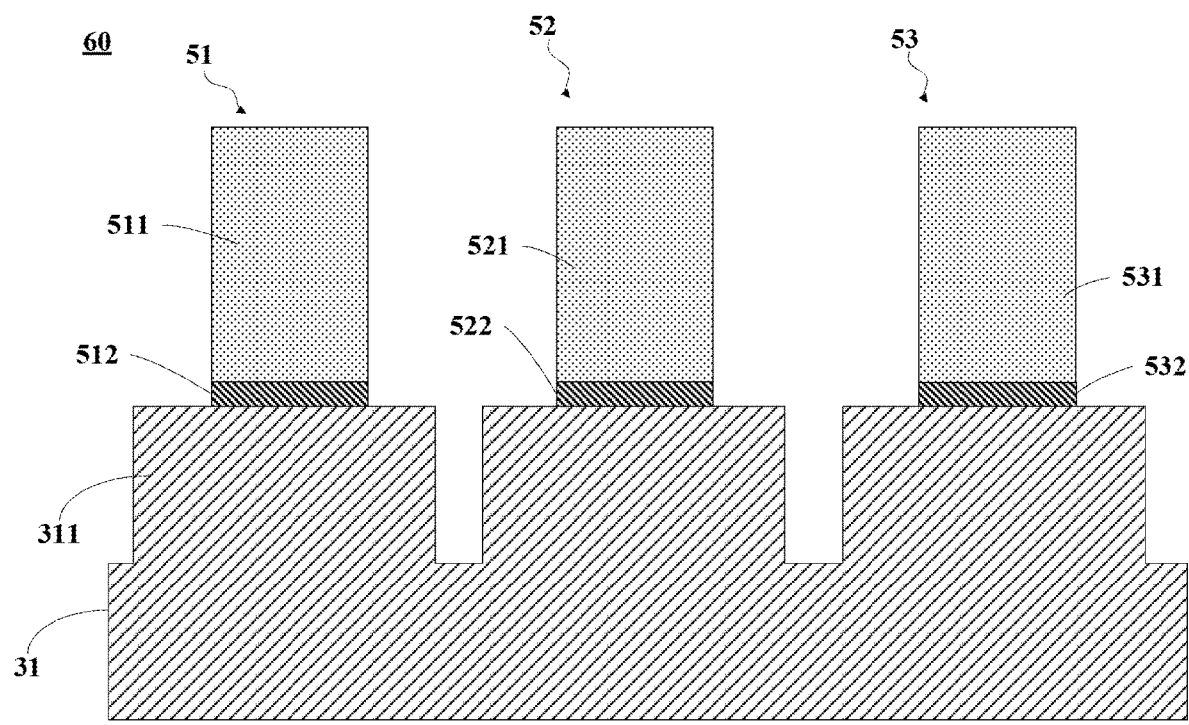
FIG. 4A is a cross-sectional view illustrating an intermediate stage in the manufacturing process of a semiconductor device according to another embodiment of the present invention.

Referring to FIG. 4A, an initial structure 60 is provided. Initial structure 60 may include substrate 31 comprising fin structure 311, which may include a plurality of fins. Initial structure 60 may also include a plurality of dummy gate structures on substrate 31, the plurality of dummy gate structures may include at least a first dummy gate structure 51 for a first transistor, a second dummy gate structure 52 for a second transistor, and a third dummy gate structure 53 for a third transistor. As shown in FIG. 4A, first, second, third dummy gate structures 51, 52, 53 are disposed on respective fins of fin structure 311.

In some embodiments, first dummy gate structure 51 may include a first dummy gate insulator 512 on substrate 31 and a first dummy gate 511 on first dummy gate insulator 512. The first dummy gate insulator may include silicon dioxide, and the first dummy gate may include polysilicon.

In some embodiments, second dummy gate structure 52 may include a second dummy gate insulator 522 on substrate 31 and a second dummy gate 521 on second dummy gate insulator 522. The second dummy gate insulator may include silicon dioxide, and the second dummy gate may include polysilicon.

In some embodiments, third dummy gate structure 53 may include a third dummy gate insulator 532 on substrate 31 and a third dummy gate 531 on third dummy gate insulator 532. The third dummy gate insulator may include silicon dioxide, and the third dummy gate may include polysilicon.

Figure 4B:
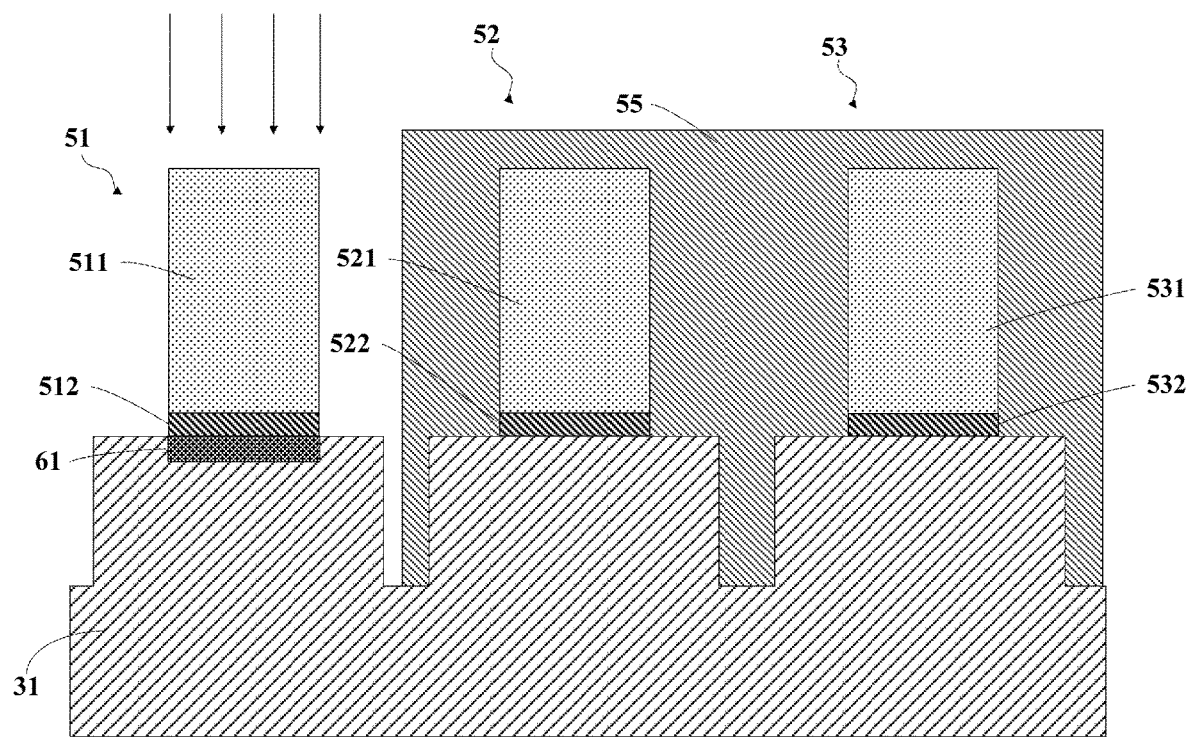
FIG. 4B is a cross-sectional view illustrating an intermediate stage in the manufacturing process of a semiconductor device according to another embodiment of the present invention.

Next, as shown in FIG. 4B, a first patterned mask layer (e.g., photoresist) 55 is formed on second and third dummy gate structures 52 and 53 while exposing a portion of the substrate including first dummy gate structure 51; the first doping is performed (e.g., ion implantation) onto the exposed portion of the substrate to form a doped region 61 (which is the portion of the substrate on which the first trench is to be formed in a subsequent step). The first doping may be of the N-type, i.e., the dopant is an N-type impurity, and the first dopant concentration is in the range between $1 \times 10^{16}$ and $1 \times 10^{17}$ atoms/cm$^3$. After the first doping has been performed, first patterned mask layer 55 is removed.

Figure 4C:
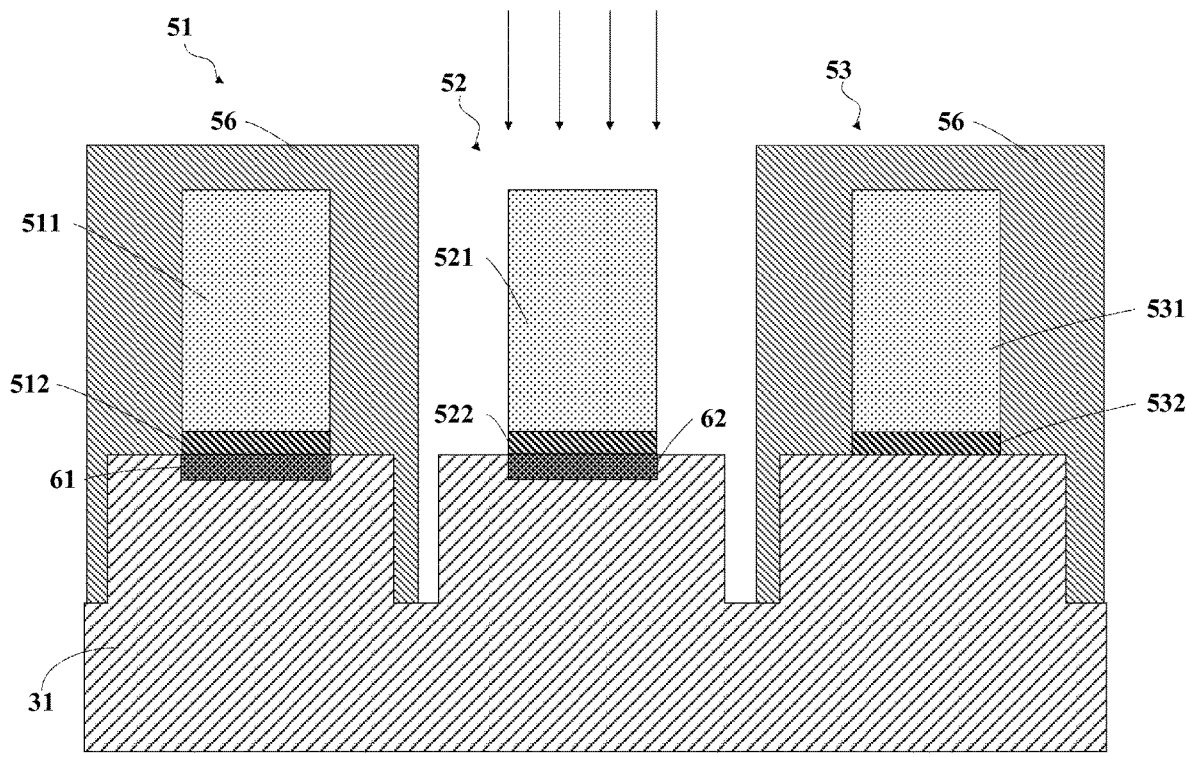
FIG. 4C is a cross-sectional view illustrating an intermediate stage in the manufacturing process of a semiconductor device according to another embodiment of the present invention.

Next, as shown in FIG. 4C, a second patterned mask layer (e.g., photoresist) 56 is formed on first and third dummy gate structures 51 and 53 while exposing a portion of the substrate including second dummy gate structure 52; the second doping is performed (e.g., ion implantation) onto the exposed portion of the substrate to form a doped region 62 (which is the portion of the substrate on which the second trench is to be formed in a subsequent step). The second doping may be of the P-type, i.e., the dopant is a P-type impurity, and the second dopant concentration is in the range between $1 \times 10^{16}$ and $3 \times 10^{18}$ atoms/cm$^3$. After the second doping has been performed, second patterned mask layer 56 is removed.

Figure 4D:
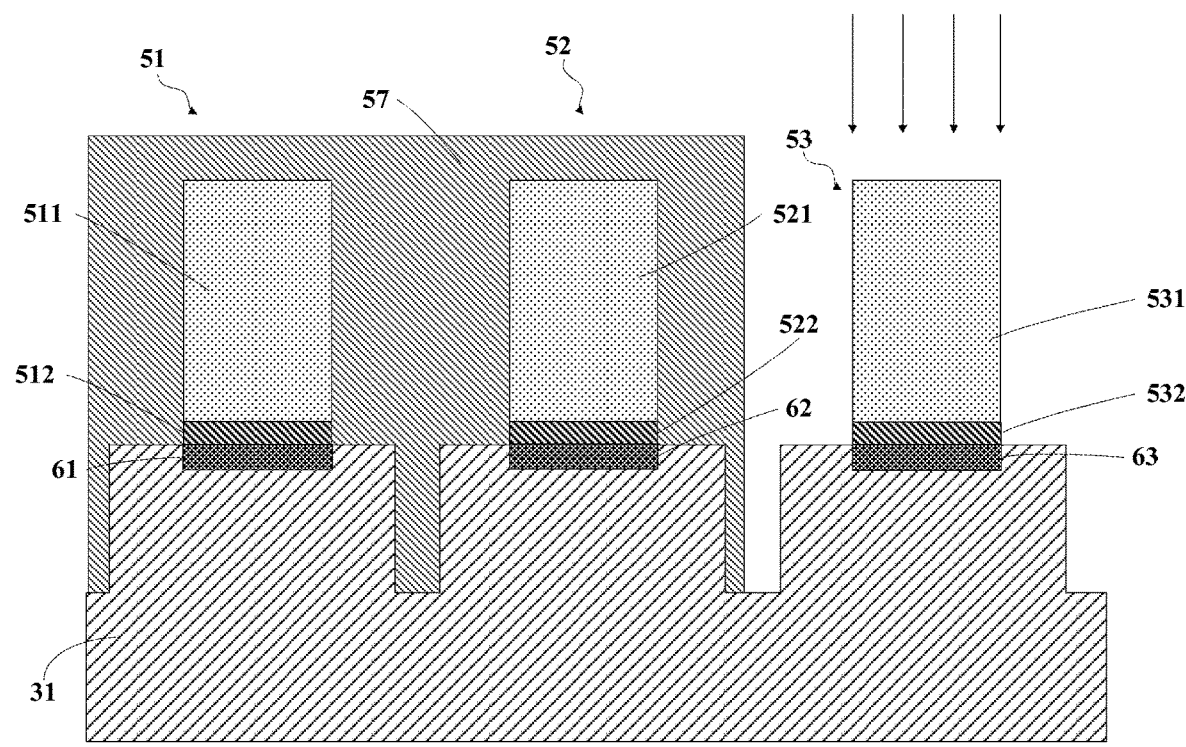
FIG. 4D is a cross-sectional view illustrating an intermediate stage in the manufacturing process of a semiconductor device according to another embodiment of the present invention.

Next, as shown in FIG. 4D, a third patterned mask layer (e.g., photoresist) 57 is formed on first and second dummy gate structures 51 and 52 while exposing a portion of the substrate including third dummy gate structure 53; the third doping is performed (e.g., ion implantation) onto the exposed portion of the substrate to form a doped region 63 (which is the portion of the substrate on which the third trench is to be formed in a subsequent step). The third doping may be of the P-type, i.e., the dopant is a P-type impurity, and the third dopant concentration is in the range between $1 \times 10^{16}$ and $1 \times 10^{17}$ atoms/cm$^3$. After the third doping has been performed, third patterned mask layer 57 is removed.

In some embodiments, the first dopant concentration of the first doping is greater than the third dopant concentration of the third doping. This may cause the channel dopant concentration in the substrate of the first transistor (e.g., the pull-up transistor) to be greater than that of the third transistor (e.g., transfer gate transistor), such that the threshold voltage of the first transistor increases, resulting in an increase of the γ ratio of the SRAM.

Figure 4E:
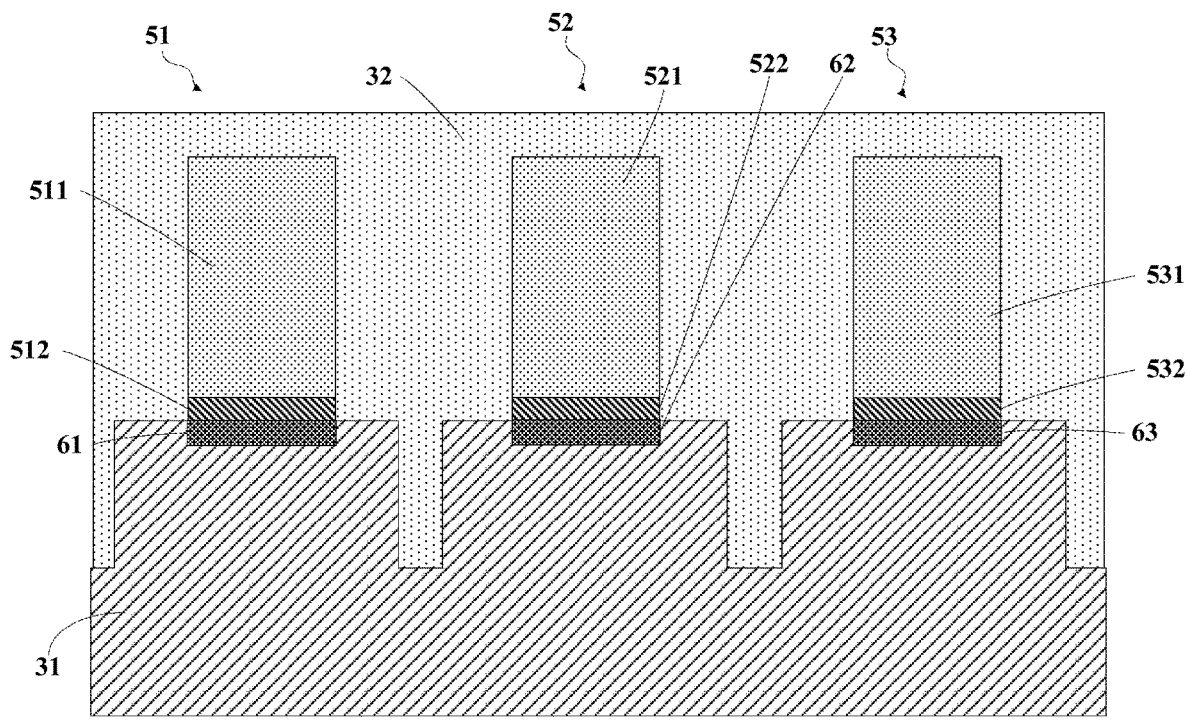
FIG. 4E is a cross-sectional view illustrating an intermediate stage in the manufacturing process of a semiconductor device according to another embodiment of the present invention.

Next, as shown in FIG. 4E, an interlayer dielectric layer 32 is formed on the first, second, and third doped regions using a deposition process. Interlayer dielectric layer 32 covers substrate 31 and the plurality of dummy gate structures, such as first, second, and third dummy gate structures 51, 52, and 53.

Figure 4F:
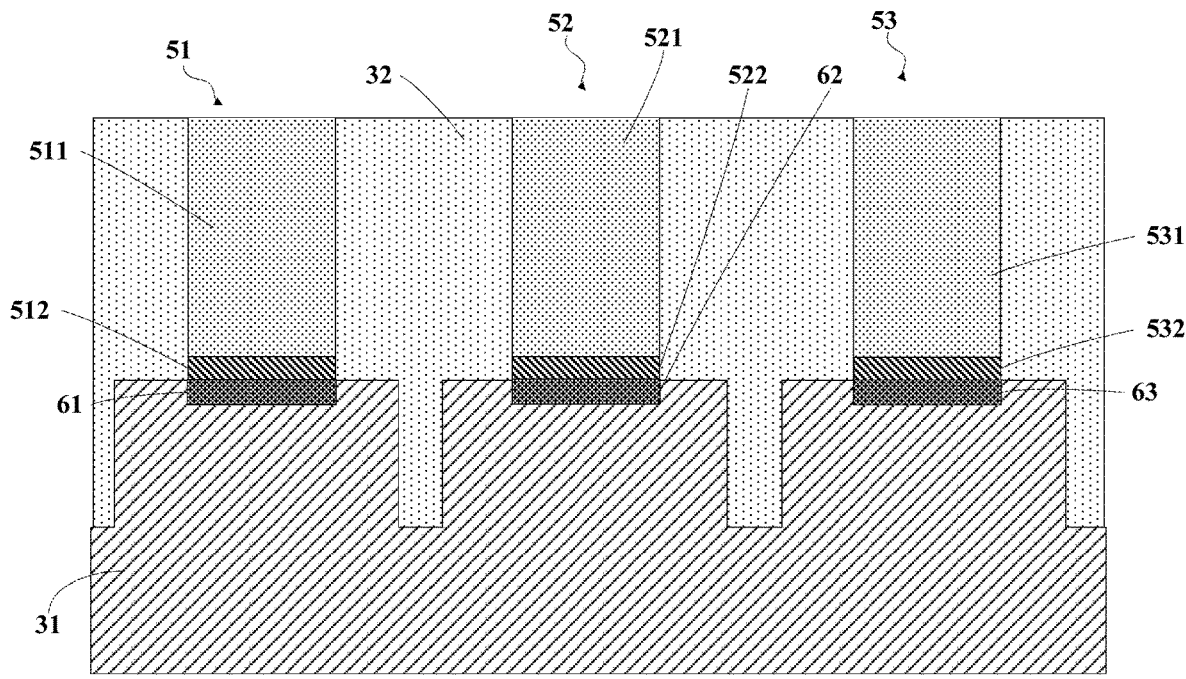
FIG. 4F is a cross-sectional view illustrating an intermediate stage in the manufacturing process of a semiconductor device according to another embodiment of the present invention.

Next, as shown in FIG. 4F, a planarization process is performed on interlayer dielectric layer 32 to expose a surface of the plurality of dummy gate structures, e.g., first, second, and third dummy gate structures 51, 52, and 53.

Figure 4G:
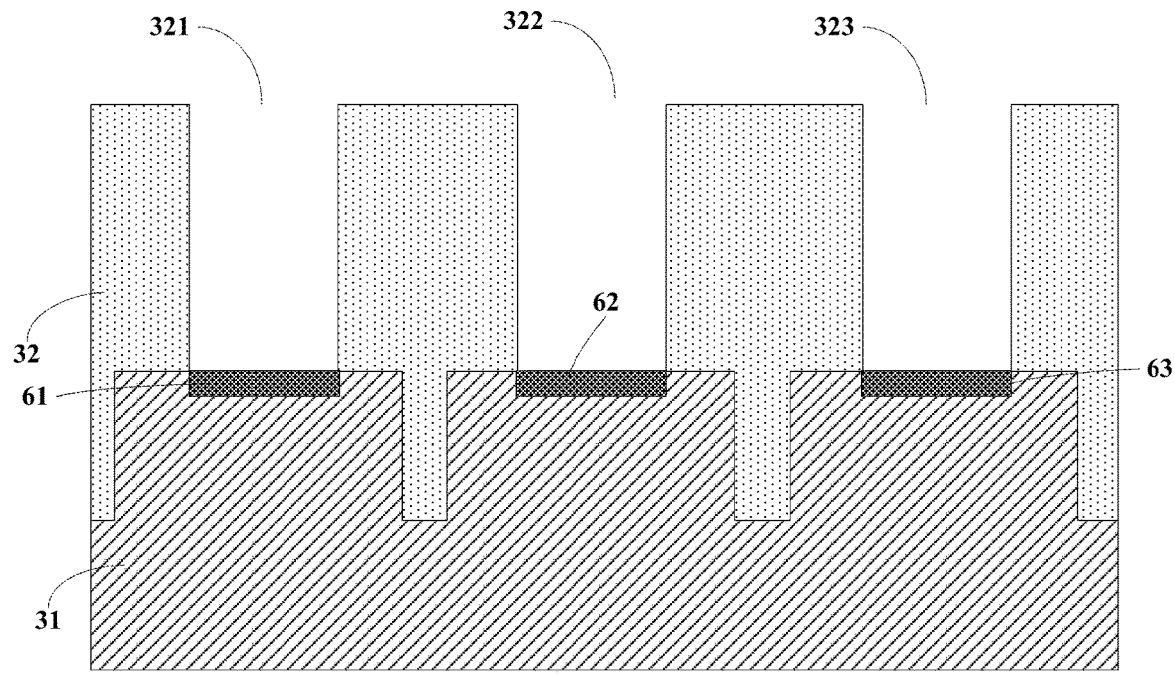
FIG. 4G is a cross-sectional view illustrating an intermediate stage in the manufacturing process of a semiconductor device according to another embodiment of the present invention.

Next, the dummy gate structures, e.g., first, second, and third dummy gate structures 51, 52, and 53, are removed using an etch process to obtain the structure as shown in FIG. 4G.

Thus, a method of performing the first, second, and third doping processes has been described. It is to be understood that the doping sequence of the first, second, and third dummy gate structures may be arbitrary chosen and not limited to the sequence described above. One of skill in the art will appreciate that other doping sequences may also be used without affecting the teachings of the embodiments of the present invention.

In the above-described embodiments, the method of performing the three doping operations with reference to FIGS. 4A through 4G is after the formation of the dummy gate structures. In other embodiments, the three doping operations may be performed prior to forming the dummy gate structures. That is, the first doping is performed on a portion of the substrate on which the first trench is to be formed, the second doping is performed on a portion of the substrate on which the second trench is to be formed, and the third doping is performed on a portion of the substrate on which the third trench is to be formed. Thus, the scope of the present invention is not limited to the method of performing the doping operations after forming the dummy gate structures.

Figure 3K:
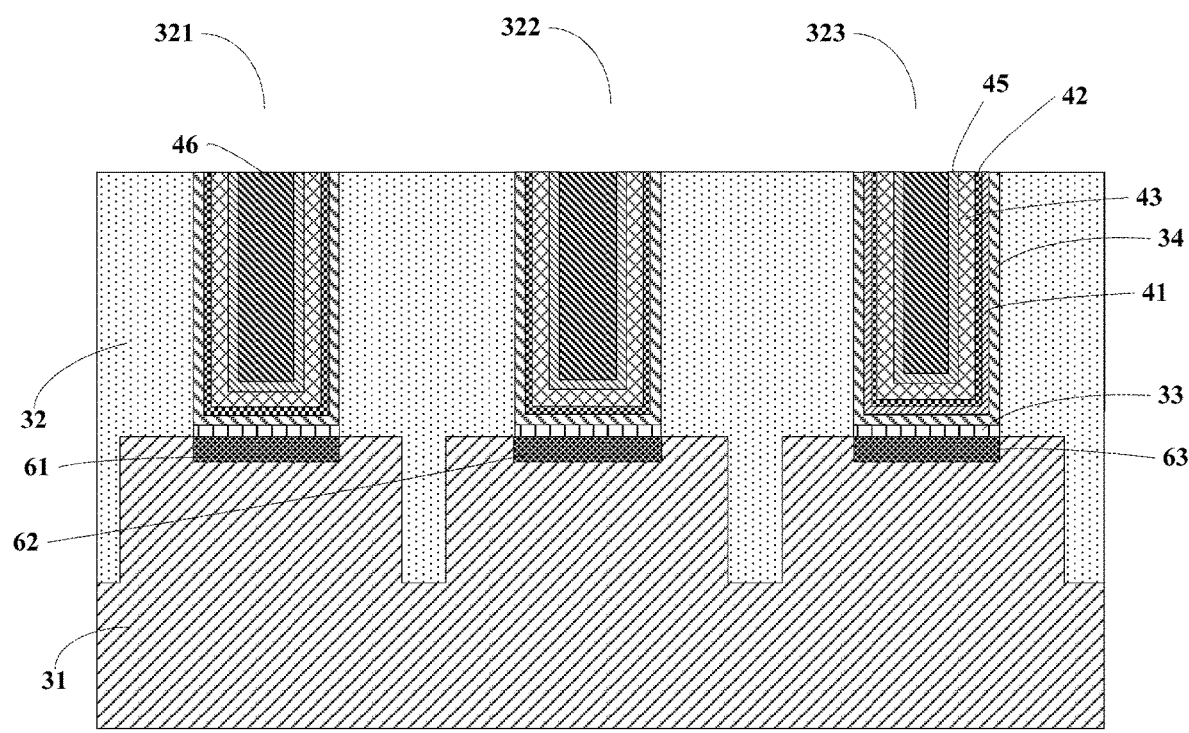
FIG. 3K is a simplified schematic diagram illustrating an intermediate process step of a method of fabricating a semiconductor device according to some embodiments of the present invention.

Embodiments of the present invention also provide another method for manufacturing a semiconductor device that may include providing a substrate structure that contains the first doped region, the second doped region and the third doped region (as shown in FIG. 4G), then performing steps S202 through S207 (that have been described in detail in the above sections) to obtain the semiconductor device of FIG. 3K.

In some embodiments, the first transistor, the second transistor, and the third transistor are the pull-up transistor, the pull-down transistor, and the transfer gate transistor of the SRAM, respectively. In some embodiments, the SRAM may also include a logic unit (not shown) that may include peripheral circuits, e.g., encoding circuit, read and write circuits, etc. The encoding circuit, read and write circuits may include logic PMOS devices and logic NMOS devices that may be used for encoding, read and write operations, etc.

In some embodiments, the interlayer dielectric layer may further include a fourth trench for forming a gate structure of the logic PMOS device and a fifth trench for forming a gate structure of the logic NMOS device. The fourth and fifth trenches each expose a surface of the substrate at their respective bottom.

Optionally, step S204 may further include forming a first PMOS work function layer on the high-k dielectric layer in the fourth trench.

Optionally, the step of removing the first PMOS work function adjustment layer in the first and second trenches to expose the surface of the high-k dielectric layer also includes removing the first PMOS work function adjustment layer in the fifth trench to expose the surface of the high-k dielectric layer in the fifth trench.

FIG. 5A through FIG. 5J are cross-sectional views illustrating intermediate stages of a semiconductor device in different process steps of a method of manufacturing according to other embodiments of the present invention.

Figure 5A:
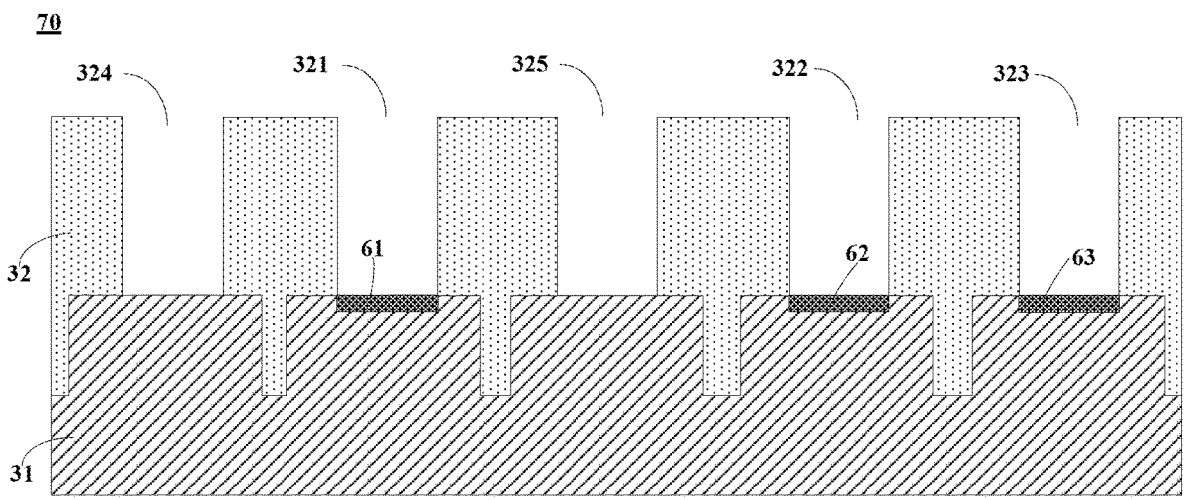
FIG. 5A is a cross-sectional view illustrating an intermediate stage in the manufacturing process of a semiconductor device according to yet another embodiment of the present invention.

Referring to FIG. 5A, a substrate structure 70 is provided. Substrate structure 70 includes substrate 31 and interlayer dielectric layer 32 on substrate 31. Interlayer dielectric layer 32 includes a plurality of trenches that expose a respective portion of a surface of substrate 31 at their bottom for a semiconductor device. The plurality of trenches may include at least a first trench 321 for forming a gate structure of a first transistor, a second trench 322 for forming a gate structure of a second transistor, and a third trench 323 for forming a gate structure of a third transistor. The plurality of trenches may further include a fourth trench 324 for forming a gate structure of a logic PMOS transistor, and a fifth trench 325 for forming a gate structure of a logic NMOS transistor. The fourth and fifth trenches each expose a portion of the surface of substrate 31 at their respective bottom.

In some embodiments, a first doped region 61 is formed in substrate 31 below the bottom of the first trench, a second doped region 62 is formed in substrate 31 below the bottom of the second trench, and a third doped region 63 is formed in substrate 31 below the bottom of the third trench, as shown in FIG. 5A.

Figure 5B:
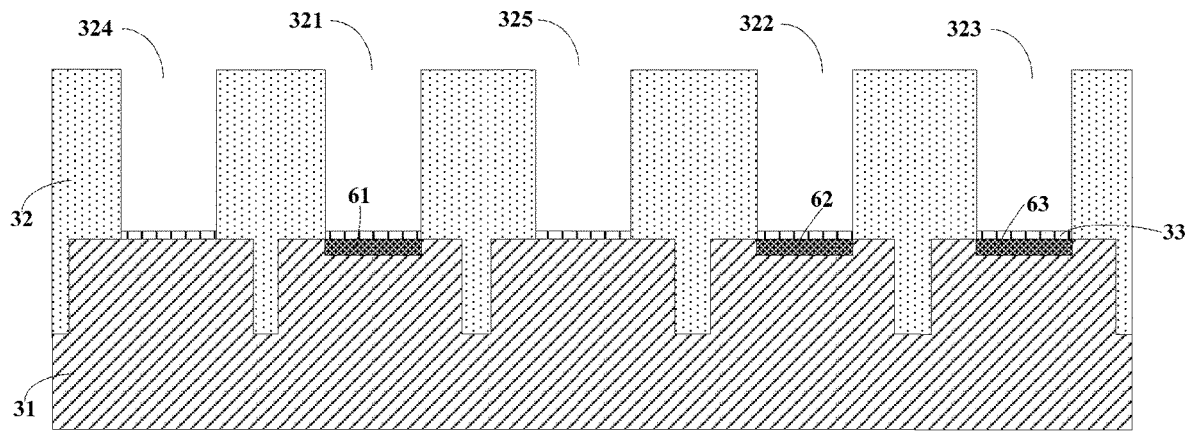
FIG. 5B is a cross-sectional view illustrating an intermediate stage in the manufacturing process of a semiconductor device according to yet another embodiment of the present invention.

Next, referring to FIG. 5B, an interlayer dielectric layer 33 is formed on the exposed portion of the surface of the substrate at the bottom of the trenches (e.g., first, second, third, fourth, and fifth trenches 321, 322, 323, 324, and 325) using a deposition or oxidation process.

Figure 5C:
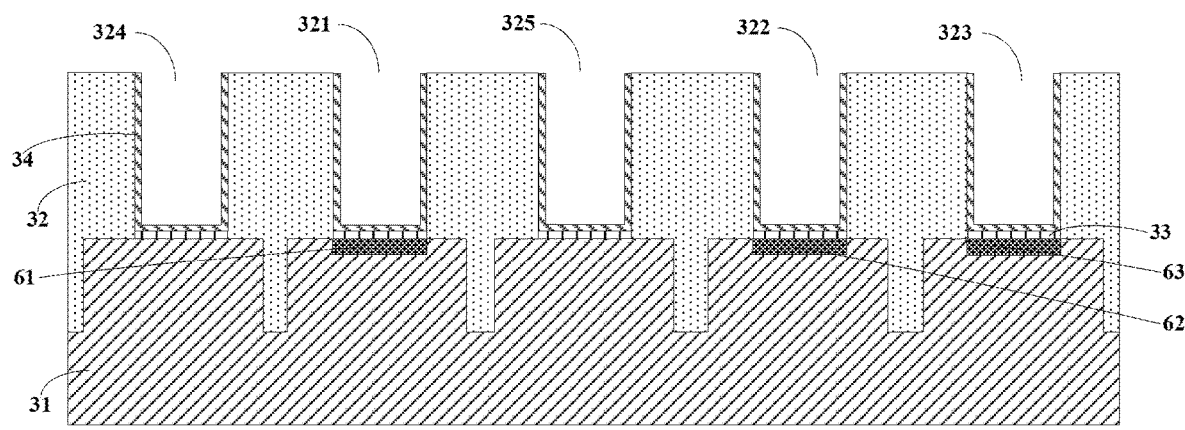
FIG. 5C is a cross-sectional view illustrating an intermediate stage in the manufacturing process of a semiconductor device according to yet another embodiment of the present invention.

Next, referring to FIG. 5C, a high-k dielectric layer 34 is formed on interlayer dielectric layer 33 and sidewalls of the trenches (e.g., first, second, third, fourth, and fifth trenches 321, 322, 323, 324, and 325) using a deposition process.

Figure 5D:
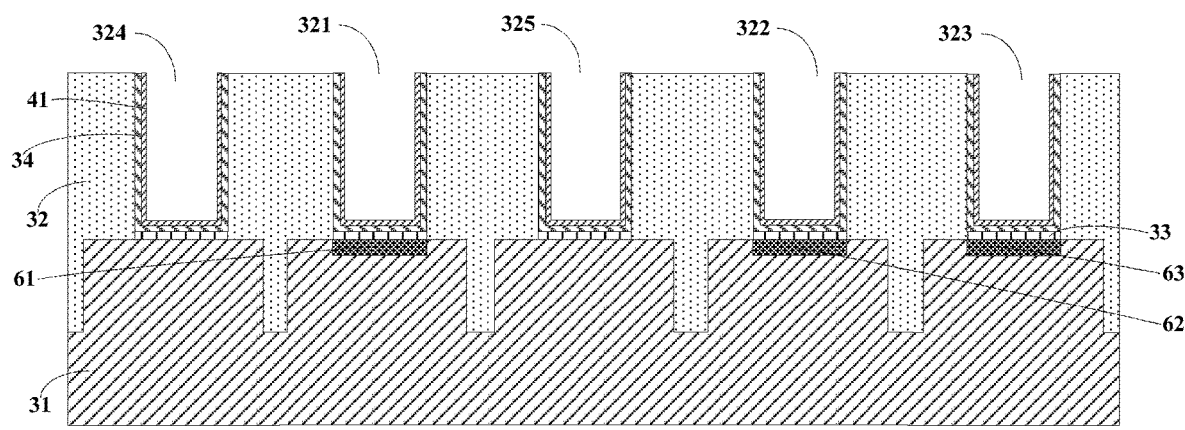
FIG. 5D is a cross-sectional view illustrating an intermediate stage in the manufacturing process of a semiconductor device according to yet another embodiment of the present invention.

Next, referring to FIG. 5D, a first PMOS work function adjustment layer 41 is formed on high-k dielectric layer 34 in the trenches (e.g., first, second, third, fourth, and fifth trenches 321, 322, 323, 324, and 325).

Figure 5E:
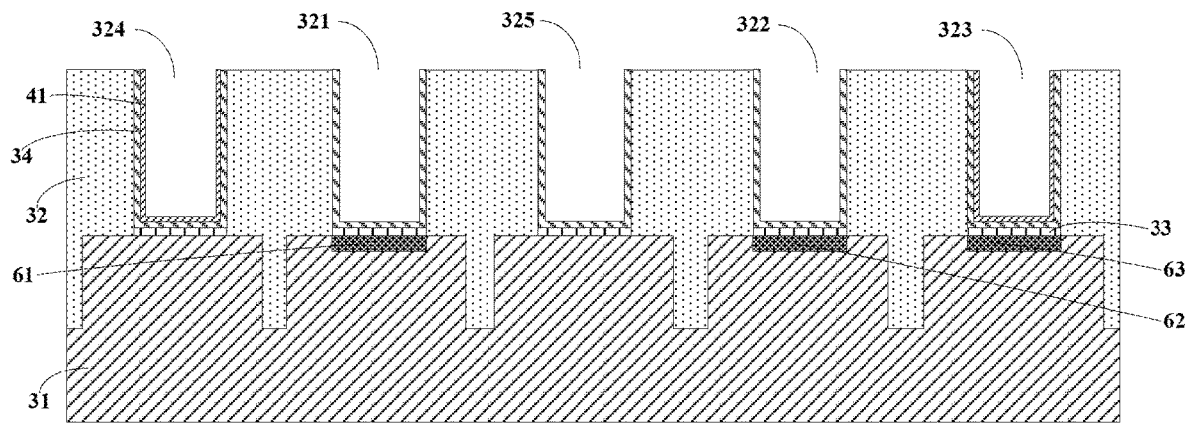
FIG. 5E is a cross-sectional view illustrating an intermediate stage in the manufacturing process of a semiconductor device according to yet another embodiment of the present invention.

Next, referring to FIG. 5E, portions of first PMOS work function adjustment layer 41 in the first, second and fifth trenches (e.g., first, second, and fifth trenches 321, 322, and 325) are removed using an etch process.

Figure 5F:
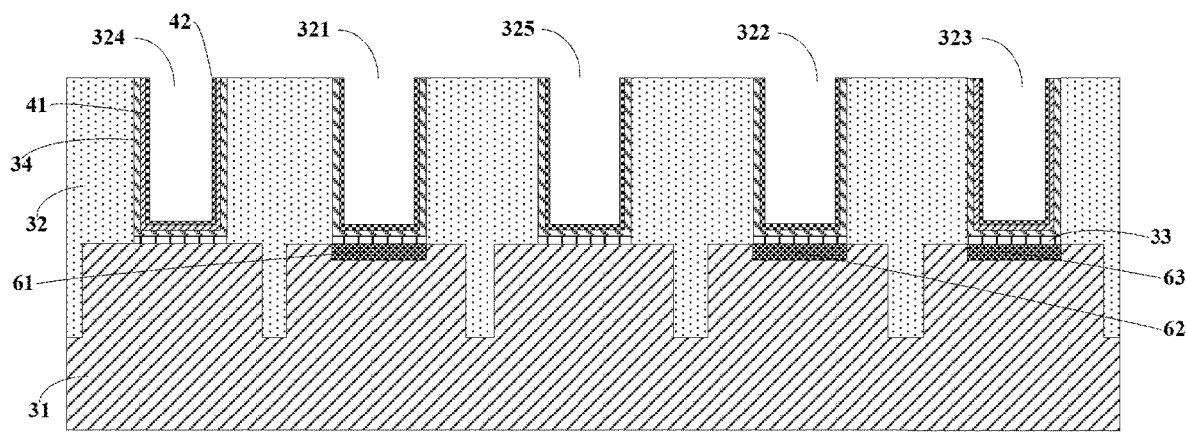
FIG. 5F is a cross-sectional view illustrating an intermediate stage in the manufacturing process of a semiconductor device according to yet another embodiment of the present invention.

Next, referring to FIG. 5F, a second PMOS work function adjustment layer 42 is formed in the trenches (e.g., first, second, third, fourth, and fifth trenches 321, 322, 323, 324, and 325) using a deposition process.

Figure 5G:
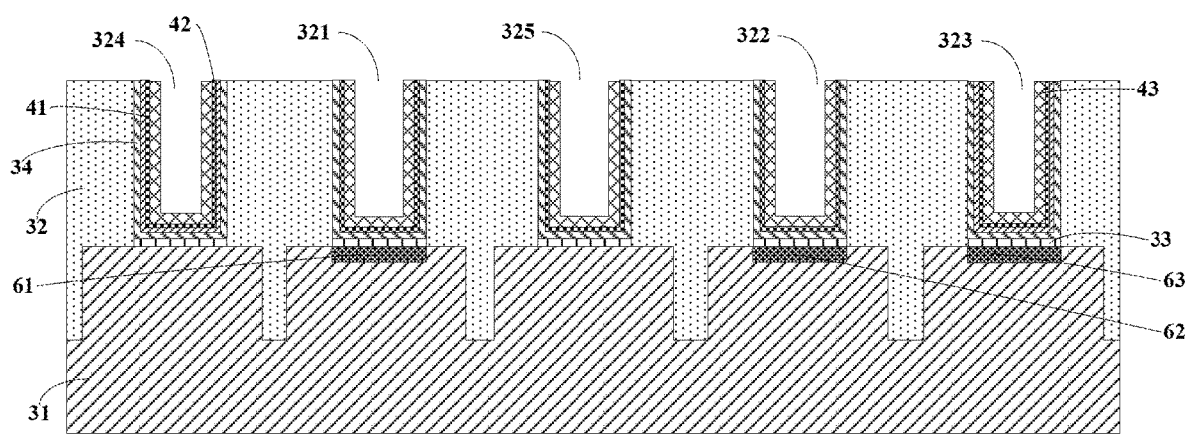
FIG. 5G is a cross-sectional view illustrating an intermediate stage in the manufacturing process of a semiconductor device according to yet another embodiment of the present invention.

Next, referring to FIG. 5G, an NMOS work function adjustment layer 43 is formed in the trenches (e.g., first, second, third, fourth, and fifth trenches 321, 322, 323, 324, and 325) using a deposition process.

Figure 5H:
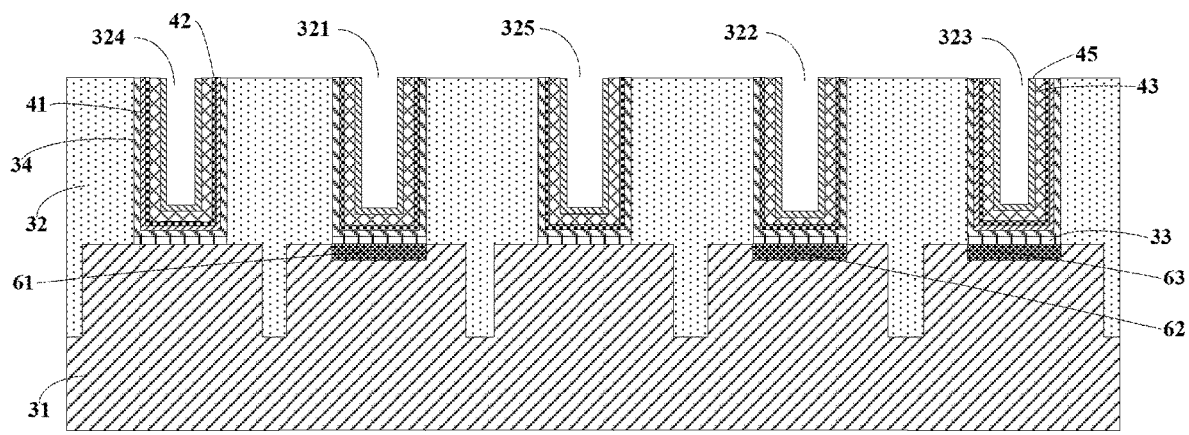
FIG. 5H is a cross-sectional view illustrating an intermediate stage in the manufacturing process of a semiconductor device according to yet another embodiment of the present invention.

Next, referring to FIG. 5H, a barrier layer 45 is formed in the trenches (e.g., first, second, third, fourth, and fifth trenches 321, 322, 323, 324, and 325) using a deposition process.

Figure 5I:
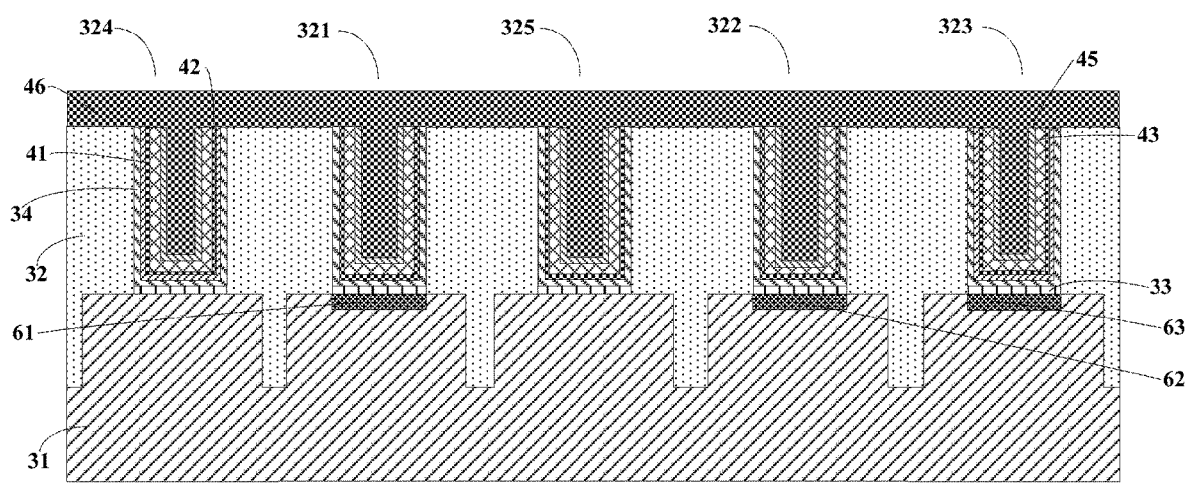
FIG. 5I is a cross-sectional view illustrating an intermediate stage in the manufacturing process of a semiconductor device according to yet another embodiment of the present invention.

Next, referring to FIG. 5I, a metal gate layer 46 is formed on the structure in FIG. 5H using a deposition process to fill the trenches (e.g., first, second, third, fourth, and fifth trenches 321, 322, 323, 324, and 325).

Figure 5J:
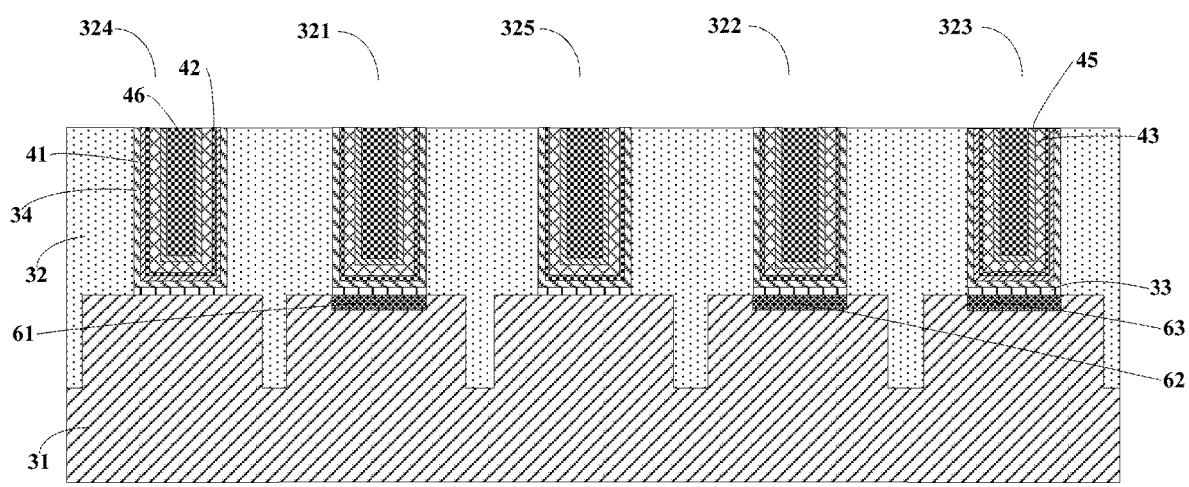
FIG. 5J is a cross-sectional view illustrating an intermediate stage in the manufacturing process of a semiconductor device according to yet another embodiment of the present invention.

Next, referring to FIG. 5J, a planarization process is performed on metal gate layer 46.

Thus, embodiments of the present invention provide another method for manufacturing a semiconductor device.

Embodiments of the present invention also provide a semiconductor device, as shown in FIG. 3K. Referring to FIG. 3K, a semiconductor device may include a substrate (e.g., silicon substrate) 31, an interlayer dielectric layer 32 on substrate 31, and a plurality of trenches in interlayer dielectric layer 32. The plurality of trenches each expose a portion of the surface of substrate 31 and include at least a first trench 321 for forming a gate structure of a first transistor, a second trench 322 for forming a gate structure of a second transistor, and a third trench 323 for forming a gate structure of a third transistor.

In some embodiments, the first transistor may be used as a pull-up transistor of an SRAM, the second transistor may be used as a pull-down transistor of the SRAM, and the third transistor may be used as a transfer gate transistor of the SRAM.

Referring still to FIG. 3K, the semiconductor device may include an interface layer 33 on the bottom of the trenches. Interface layer 33 may include silicon dioxide and has a thickness in the range between 5 Å and 10 Å, e.g., 7 Å.

In some embodiments, referring still to FIG. 3K, the semiconductor device may further include a high-k dielectric layer 34 on interface layer 33 and sidewalls of the trenches. High-k dielectric layer 34 may include silicon nitride and has a thickness in the range between 5 Å and 20 Å, e.g., 10 Å, 15 Å, etc.

In some embodiments, referring still to FIG. 3K, the semiconductor device may further include a first PMOS work function adjustment layer 41 on high-k dielectric layer 34 in third trench 323. First PMOS work function adjustment layer 41 may include titanium nitride (TiN) and has a thickness in the range between 5 Å and 15 Å, e.g., 10 Å.

In some embodiments, referring still to FIG. 3K, the semiconductor device may also include a second PMOS work function adjustment layer 42 on high-k dielectric layer 34 in first trench 321 and in second trench 322, and on first PMOS work function adjustment layer 41 in third trench 323. Second PMOS work function adjustment layer 42 may include titanium nitride (TiN) and has a thickness in the range between 10 Å and 35 Å, e.g., 20 Å, or 30 Å, etc.

In some embodiments, the first and second PMOS work function adjustment layers are used to increase the threshold voltage of the third transistor.

In some embodiments, referring still to FIG. 3K, the semiconductor device may also include an NMOS work function layer 43 on second PMOS work function adjustment layer 42 in first trench 321, second trench 322, and third trench 323. NMOS work function layer 43 may include titanium aluminum carbide (TiAlC) and has a thickness in the range between 30 Å and 80 Å, e.g., 40 Å, 50 Å or 70 Å, etc.

In some embodiments, the NMOS work function adjustment layer is used to increase the threshold voltage of the first transistor.

In some embodiments, the NMOS work function adjustment layer has a thickness that is greater than the sum of the thicknesses of the first and second PMOS work function adjustment layers.

In some embodiments, referring still to FIG. 3K, the semiconductor device may also include a barrier layer 45 on NMOS work function adjustment layer 43 in first, second and third trenches 321, 322, and 323, and a metal gate layer 46 on barrier layer 45 in first, second and third trenches 321, 322, and 323. Barrier layer 45 may include titanium nitride and has a thickness in the range between 15 Å and 70 Å, e.g., 30 Å, or 50 Å, etc. Metal gate layer 46 may include a metal such as tungsten.

In some embodiments, referring still to FIG. 3K, a portion of substrate 31 below the bottom of the first trench (i.e., first doped region 61) is doped with an N-type dopant, and the N-type dopant concentration is in the range between $1 \times 10^{16}$ and $1 \times 10^{17}$ atoms/cm$^3$.

In some embodiments, referring still to FIG. 3K, a portion of substrate 31 below the bottom of the second trench (i.e., second doped region 62) is doped with a first P-type dopant, and the first P-type dopant concentration is in the range between $1 \times 10^{16}$ and $3 \times 10^{18}$ atoms/cm$^3$.

In some embodiments, referring still to FIG. 3K, a portion of substrate 31 below the bottom of the third trench (i.e., third doped region 63) is doped with a second P-type dopant, and the second P-type dopant concentration is in the range between $1 \times 10^{16}$ and $1 \times 10^{17}$ atoms/cm$^3$.

In some embodiments, the N-type dopant concentration is greater than the second P-type dopant concentration to control the conduction currents of the PG transistor and PU transistor to obtain an even higher gamma ratio.

Embodiments of the present invention also provide another semiconductor device, as shown in FIG. 5J. The semiconductor device of FIG. 5J includes a structure similar to that of the semiconductor described and shown in FIG. 3K. Referring to FIG. 5J, the semiconductor device may include a substrate (e.g., silicon substrate) 31, an interlayer dielectric layer 32 on substrate 31, and a plurality of trenches in interlayer dielectric layer 32, as described in reference to FIG. 3K. Additionally, the trenches also a fourth trench 324 for forming a gate structure of a logic PMOS device and a fifth trench 325 for forming a gate structure of a logic NMOS device. Interface layer 33 is on the bottom of fourth and fifth trenches 324 and 325, and high-k dielectric layer 34 is on interface layer 33 and on sidewalls of fourth and fifth trenches 324 and 325.

In some embodiments, referring to FIG. 5J, the semiconductor device may also include first PMOS work function adjustment layer 41 on high-k dielectric layer 34 in fourth trench 324.

In some embodiments, referring still to FIG. 5J, the semiconductor device may also include second PMOS work function adjustment layer 42 on high-k dielectric layer 34 in fifth trench 325 and on first PMOS work function adjustment layer 41 in fourth trench 324.

In some embodiments, referring still to FIG. 5J, the semiconductor device may also include NMOS work function layer 43 on second PMOS work function adjustment layer 42 in fourth trench 324 and in fifth trench 325.

In some embodiments, referring still to FIG. 5J, the semiconductor device may also include barrier layer 45 on NMOS work function adjustment layer 43 in fourth trench 324 and in fifth trench 325, and metal gate layer 46 on barrier layer 45.

The semiconductor device in accordance with the present invention may increase the β ratio or the γ ratio of the SRAM, thereby improving the read noise margin or write margin.

Embodiments of the present invention also provide an electronic device that may include a semiconductor device having memory cells of the structures of the different exemplary embodiments described above, such as memory cells having different numbers of pull-up, pull-down, and pass-gate transistors described above. Because the electronic device uses such semiconductor devices having increased β or γ ratio, the electronic device may have improved performance. In an embodiment, the electronic device can be a mobile phone, tablet PC, laptop, netbook, game console, still camera, video camera, voice recorder, MP3, MP4, PSP, and the like.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
a substrate comprising a fin structure having a plurality of fins and a recess in the substrate and disposed between adjacent fins;
an interlayer dielectric layer on the substrate and filling the recess;
a plurality of trenches comprising at least a first trench configured to form a gate structure of a first transistor, a second trench configured to form a gate structure of a second transistor, a third trench configured to form a gate structure of a third transistor, a fourth trench configured to form a gate structure of a logic PMOS transistor, and a fifth trench configured to form a gate structure of a logic NMOS transistor, each of the trenches having a bottom on an upper surface of each fin, wherein all of the first trench, the second trench, the third trench, the fourth trench, and the fifth trench have a same depth, and the first transistor is a pull-up transistor of an SRAM; the second transistor is a pull-down transistor of the SRAM, the third transistor is a transfer gate transistor of the SRAM;
an interface layer on the bottom of each of the trenches;
a high-k dielectric layer on the interface layer;
a first PMOS work function adjustment layer on the high-k dielectric layer of the third trench and the fourth trench;
a second PMOS work function adjustment layer on the high-k dielectric layer of the first, second, and fifth trenches and on the first PMOS work function adjustment layer of the third trench and the fourth trench;
an NMOS work function adjustment layer on the second PMOS work function adjustment layer of the first, second, third, fourth, and fifth trenches;
a barrier layer on the NMOS work function adjustment layer of the first, second, third, fourth, and fifth trenches;
a first doped region in the substrate below the bottom of the first trench comprising an N-type dopant; a second doped region in the substrate below the bottom of the second trench comprising a first P-type dopant; and a third doped region in the substrate below the bottom of the third trench comprising a second P-type dopant, wherein the first doped region has a dopant concentration higher than a dopant concentration of the third doped region; and
a metal gate layer on the barrier layer.

2. The semiconductor device of claim 1, wherein the first PMOS work function adjustment layer and the second PMOS work function adjustment layer increase a threshold voltage of the third transistor; and the NMOS work function adjustment layer increases a threshold voltage of the first transistor.

3. The semiconductor device of claim 1, wherein the N-type dopant in the first doped region has a dopant concentration in a range between $1\times10^{16}$ and $1\times10^{17}$ atoms/cm$^3$; the first P-type dopant in the second doped region has a dopant concentration in a range between $1\times10^{16}$ and $3\times10^{18}$ atoms/cm$^3$; and the second P-type dopant in the third doped region has a dopant concentration in a range between $1\times10^{16}$ and $1\times10^{17}$ atoms/cm$^3$.

4. The semiconductor device of claim 1, wherein the first and second PMOS work function adjustment layers each comprise titanium nitride, and the NMOS work function adjustment layer comprises titanium aluminum carbide.

5. The semiconductor device of claim 1, wherein the NMOS work function adjustment layer has a thickness greater than a sum of thicknesses of the first and second PMOS work function adjustment layers.

6. The semiconductor device of claim 1, wherein the first PMOS work function adjustment layer has a thickness in a range between 5 Å and 15 Å; the second PMOS work function adjustment layer has a thickness in a range between 10 Å and 35 Å the NMOS work function adjustment layer has a thickness in a range between 30 Å and 80 Å.

7. The semiconductor device of claim 1, wherein the interface layer comprises silicon dioxide; the barrier layer comprises titanium nitride; the metal gate layer comprises tungsten.

8. The semiconductor device of claim 1, wherein the interface layer has a thickness in a range between 5 Å and 10 Å; the high-k dielectric layer has a thickness in a range between 5 Å and 20 Å; the barrier layer has a thickness in a range between 15 Å and 70 Å.

9. A semiconductor device, comprising:
- a substrate comprising a fin structure having a plurality of fins and a plurality of recesses in the substrate and disposed between adjacent fins and both side surfaces of the fin structure;
- an interlayer dielectric layer on the substrate and filling the plurality of recesses;
- a plurality of trenches comprising at least a first trench configured to form a gate structure of a first transistor, a second trench configured to form a gate structure of a second transistor, a third trench configured to form a gate structure of a third transistor, each of the trenches having a bottom on an upper surface of each fin, wherein all of the first trench, the second trench, and the third trench have a same depth, and the first transistor is a pull-up transistor of an SRAM; the second transistor is a pull-down transistor of the SRAM, the third transistor is a transfer gate transistor of the SRAM;
- an interface layer on the bottom of each of the trenches;
- a high-k dielectric layer on the interface layer;
- a first PMOS work function adjustment layer comprising titanium nitride on the high-k dielectric layer of the third trench;
- a second PMOS work function adjustment layer comprising titanium nitride on the high-k dielectric layer of the first and second trenches and on the first PMOS work function adjustment layer of the third trench;
- an NMOS work function adjustment layer comprising titanium aluminum carbide on the second PMOS work function adjustment layer of the first, second, and third trenches;
- a barrier layer on the NMOS work function adjustment layer of the first, second, and third trenches;
- a first doped region in the substrate below the bottom of the first trench comprising an N-type dopant; a second doped region in the substrate below the bottom of the second trench comprising a first P-type dopant; and a third doped region in the substrate below the bottom of the third trench comprising a second P-type dopant, wherein the first doped region has a dopant concentration higher than a dopant concentration of the third doped region; and
- a metal gate layer on the barrier layer.

10. The semiconductor device of claim 9, wherein the first and second PMOS work function adjustment layers each comprise titanium nitride, and the NMOS work function adjustment layer comprises titanium aluminum carbide.

11. The semiconductor device of claim 9, wherein the NMOS work function adjustment layer has a thickness greater than a sum of thicknesses of the first and second PMOS work function adjustment layers.

12. The semiconductor device of claim 9, wherein the interface layer comprises silicon dioxide; the barrier layer comprises titanium nitride; the metal gate layer comprises tungsten.

13. The semiconductor device of claim 9, wherein the first transistor is a pull-up transistor of an SRAM; the second transistor is a pull-down transistor of the SRAM; the third transistor is a transfer gate transistor of the SRAM.

* * * * *